US012696623B2

(12) United States Patent
Park et al.

(10) Patent No.: US 12,696,623 B2
(45) Date of Patent: Jul. 28, 2026

(54) DISPLAY PANEL AND METHOD FOR MANUFACTURING THE SAME

(71) Applicant: Samsung Display Co., LTD., Yongin-si (KR)

(72) Inventors: Joonyong Park, Yongin-si (KR); Hyuneok Shin, Yongin-si (KR); Juhyun Lee, Yongin-si (KR); Samtae Jeong, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 350 days.

(21) Appl. No.: 18/234,955

(22) Filed: Aug. 17, 2023

(65) Prior Publication Data

US 2024/0172482 A1 May 23, 2024

(30) Foreign Application Priority Data

Nov. 23, 2022 (KR) ........................ 10-2022-0157982

(51) Int. Cl.
*H10K 59/122* (2023.01)
*H10K 59/12* (2023.01)
(Continued)

(52) U.S. Cl.
CPC ....... *H10K 59/122* (2023.02); *H10K 59/1201* (2023.02); *H10K 71/231* (2023.02); *H10K 71/60* (2023.02); *H10K 2102/351* (2023.02)

(58) Field of Classification Search
CPC .. H10K 59/122; H10K 59/1201; H10K 71/60; H10K 71/231; H10K 2102/351
See application file for complete search history.

(56) References Cited

U.S. PATENT DOCUMENTS

| | | | |
|---|---|---|---|
| 9,054,058 B2 | 6/2015 | Sugisawa et al. | |
| 10,090,370 B2 | 10/2018 | Lee et al. | |
| (Continued) | | | |

FOREIGN PATENT DOCUMENTS

| | | | |
|---|---|---|---|
| EP | 4016145 A1 | 6/2022 | |
| JP | 2008135325 A | 6/2008 | |
| (Continued) | | | |

OTHER PUBLICATIONS

Extended European Search Report for Application No. 23208938.3-1211 dated Sep. 23, 2024, enumerating the above listed references.

*Primary Examiner* — Anne M Hines
(74) *Attorney, Agent, or Firm* — CANTOR COLBURN LLP

(57) ABSTRACT

A display panel includes a pixel defining film which is disposed on a base layer and in which a light-emitting opening is defined, a partitioning wall which is disposed on the pixel defining film and in which a partitioning wall opening corresponding to the light-emitting opening is defined, and a light-emitting element including an anode, a middle layer, and a cathode which contacts the partitioning wall. The light-emitting element is disposed in the partitioning wall opening. The partitioning wall includes a first partitioning wall layer disposed on the pixel defining film and defining a portion of a first area of the partitioning wall opening, a second partitioning wall layer disposed on the first partitioning wall layer and defining a portion of a second area of the partitioning wall opening. A width of the first area is different from a width of the second area.

19 Claims, 21 Drawing Sheets

(51) Int. Cl.
    *H10K 71/20*         (2023.01)
    *H10K 71/60*         (2023.01)
    *H10K 102/00*      (2023.01)

(56)           References Cited

U.S. PATENT DOCUMENTS

| | | | |
|---|---|---|---|
| 11,112,665 | B2 | 9/2021 | Lee et al. |
| 11,348,983 | B1 | 5/2022 | Choung et al. |
| 11,489,145 | B2 | 11/2022 | Bae et al. |
| 2013/0288413 | A1 | 10/2013 | Choi et al. |
| 2020/0312930 | A1 | 10/2020 | Choi et al. |
| 2022/0344417 | A1 | 10/2022 | Choung et al. |
| 2024/0090272 | A1* | 3/2024 | Tabatake ............. H10K 59/873 |

FOREIGN PATENT DOCUMENTS

| | | | |
|---|---|---|---|
| KR | 20090002717 | A | 1/2009 |
| KR | 20130007971 | A | 1/2013 |
| KR | 20200009172 | A | 1/2020 |
| KR | 20210008265 | A | 1/2021 |
| KR | 102239839 | B1 | 4/2021 |
| KR | 102465826 | B1 | 11/2022 |

* cited by examiner

FIG. 8

DISPLAY PANEL AND METHOD FOR MANUFACTURING THE SAME

This application claims priority to Korean Patent Application 10-2022-0157982 filed on Nov. 23, 2022, and all the benefits accruing therefrom under 35 U.S.C. § 119, the content of which in its entirety is herein incorporated by reference.

BACKGROUND

1. Field

Embodiments of the disclosure described herein relate to a display panel and a method for manufacturing the display panel and more particularly, to a display panel with improved display quality.

2. Description of the Related Art

A display device such as a television, a monitor, a smart phone, and a tablet that provides an image to a user includes a display panel that displays the image. Various display panels such as a liquid crystal display panel, an organic light-emitting display panel, an electrowetting display panel, and an electrophoretic display panel are being developed.

The organic light-emitting display panel may include an anode, a cathode, and a light-emitting pattern. Light-emitting patterns of different light-emitting areas are isolated from each other. The cathode may provide a common voltage to the light-emitting areas.

SUMMARY

Embodiments of the disclosure provide a display panel with improved display quality and a method for manufacturing the display panel, in which a light-emitting element is formed without using a metal mask.

In an embodiment of the disclosure, a display panel includes a base layer, a pixel defining film which is disposed on the base layer and in which a light-emitting opening is defined, a partitioning wall which is disposed on the pixel defining film and in which a partitioning wall opening corresponding to the light-emitting opening is defined, and a light-emitting element including an anode, a middle layer, and a cathode which contacts the partitioning wall. The light-emitting element is disposed in the partitioning wall opening. The partitioning wall includes a first partitioning wall layer disposed on the pixel defining film and defining a first portion of a first area of the partitioning wall opening, a second partitioning wall layer disposed on the first partitioning wall layer and defining a second portion of the first area and a first portion of a second area of the partitioning wall opening, and a third partitioning wall layer disposed on the second partitioning wall layer and defining a second portion of the second area of the partitioning wall opening. A width of the first area is different from a width of the second area.

In an embodiment, the first partitioning wall layer may include an indium zinc oxide.

In an embodiment, the second partitioning wall layer may include a molybdenum tantalum alloy oxide.

In an embodiment, the third partitioning wall layer may include an aluminum oxide.

In an embodiment, the third partitioning wall layer may include a material having a Young's modulus of about 300 gigapascals (GPa) or greater.

In an embodiment, a thickness of the first partitioning wall layer may be in a range of about 1000 angstroms to about 2500 angstroms.

In an embodiment, a thickness of the second partitioning wall layer may be in a range of about 4000 angstroms to about 5000 angstroms.

In an embodiment, light transmittance of the second partitioning wall layer may be about 0.5% or lower.

In an embodiment, a thickness of the third partitioning wall layer may be in a range of about 500 angstroms to about 1000 angstroms.

In an embodiment, the partitioning wall may have an undercut shape and the cathode may contact an inner side face of the first partitioning wall layer of the partitioning wall.

In an embodiment, the display panel may further include a sacrificial pattern disposed between the anode and the pixel defining film. A sacrificial opening overlapping the light-emitting opening may be defined in the sacrificial pattern.

In an embodiment, the sacrificial pattern may include an azo compound.

In an embodiment of the disclosure, a display panel includes a base layer, a pixel defining film which is disposed on the base layer and in which a light-emitting opening is defined, a partitioning wall which is disposed on the pixel defining film and in which a partitioning wall opening corresponding to the light-emitting opening is defined, and a light-emitting element including an anode, a middle layer, and a cathode which contacts the partitioning wall. The light-emitting element is disposed in the partitioning wall opening. The partitioning wall includes a first partitioning wall layer disposed on the pixel defining film and including an indium zinc oxide, a second partitioning wall layer disposed on the first partitioning wall layer and including a molybdenum-tantalum alloy oxide, and a third partitioning wall layer disposed on the second partitioning wall layer, and including an aluminum oxide.

In an embodiment, the first partitioning wall layer and a first portion of the second partitioning wall layer may define a first area of the partitioning wall opening. A second portion of the second partitioning wall layer and the third partitioning wall layer may define a second area of the partitioning wall opening.

In an embodiment, the display panel may further include a sacrificial pattern disposed on the anode. The sacrificial pattern may include an azo compound. A sacrificial opening overlapping the light-emitting opening may be defined in the sacrificial pattern.

In an embodiment, a thickness of the first partitioning wall layer may be in a range of about 1000 angstroms to about 2500 angstroms. A thickness of the second partitioning wall layer may be in a range of about 4000 angstroms to about 5000 angstroms. A thickness of the third partitioning wall layer may be in a range of about 500 angstroms to about 1000 angstroms.

In an embodiment, light transmittance of the second partitioning wall layer may be about 0.5% or lower. The third partitioning wall layer may include a material having a Young's modulus of about 300 GPa or greater.

In an embodiment of the disclosure, a method for manufacturing a display panel includes providing a pre-display panel including a base layer, an anode disposed on the base layer, and a pre-pixel defining film disposed on the base layer, forming a first pre-partitioning wall layer including an indium zinc oxide on the pre-display panel, forming a second pre-partitioning wall layer including a molybdenum-tantalum alloy oxide on the first pre-partitioning wall layer, forming a third pre-partitioning wall layer including an aluminum oxide on the second pre-partitioning wall layer, etching the first to third pre-partitioning wall layers and forming a partitioning wall in which a partitioning wall opening is defined, and forming a light-emitting pattern and a cathode in the partitioning wall opening. The cathode contacts the partitioning wall.

In an embodiment, the etching the first to third pre-partitioning wall layers and the forming the partitioning wall in which the partitioning wall opening is defined may include performing first etching of the first to third pre-partitioning wall layers, and performing second etching of the first pre-partitioning wall layer and the second pre-partitioning wall layer and forming a first partitioning wall layer, a second partitioning wall layer, and a third partitioning wall layer. The first partitioning wall layer and a first portion of the second partitioning wall layer may define a first area of the partitioning wall opening. A second portion of the second partitioning wall layer and the third partitioning wall layer may define a second area of the partitioning wall opening. The second area may have a width different from a width of the first area.

In an embodiment, the pre-display panel further may include a pre-sacrificial pattern disposed between the anode and the pre-pixel defining film. The pre-sacrificial pattern may include an azo compound. The method may further include etching the pre-sacrificial pattern to form a sacrificial pattern in which a sacrificial opening overlapping the anode is defined.

BRIEF DESCRIPTION OF THE DRAWINGS

The above and other embodiments, advantages and features of the disclosure will become apparent by describing in detail embodiments thereof with reference to the accompanying drawings.

FIG. 8 is a cross-sectional view taken along line II-IP of FIG. 5.

DETAILED DESCRIPTION

Figure 1A:
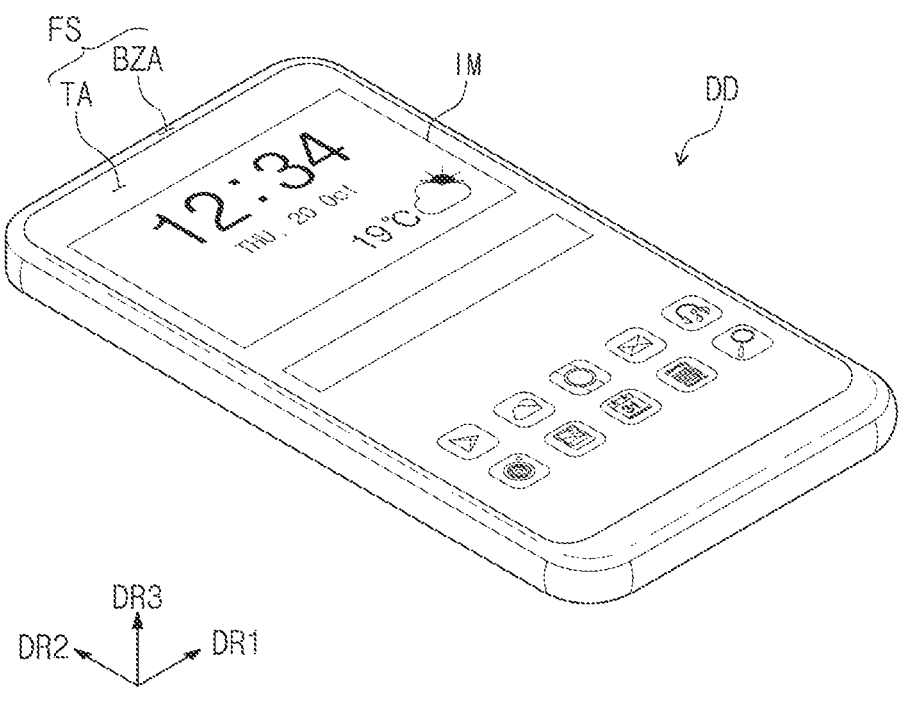
FIG. 1A is a perspective view of an embodiment of a display device according to the disclosure.

As used herein, when a component (or a region, a layer, a portion, and the like) is referred to as being "on", "connected to", or "coupled to" another component, it means that the component may be directly disposed/connected/coupled on another component or a third component may be disposed between the component and another component.

Like reference numerals refer to like components. In addition, in the drawings, thicknesses, ratios, and dimensions of components are exaggerated for effective description of technical content. "and/or" includes all of one or more combinations that the associated components may define.

Terms such as first, second, and the like may be used to describe various components, but the components should not be limited by the terms. The above terms are used only for the purpose of distinguishing one component from another. For example, without departing from the scope of the present disclosure, a first component may be named as a second component, and similarly, the second component may also be named as the first component. The singular expression includes the plural expression unless the context clearly dictates otherwise.

In addition, terms such as "beneath", "below", "on", "above" are used to describe the relationship of the components illustrated in the drawings. The above terms are relative concepts, and are described with reference to directions indicated in the drawings.

It should be understood that terms such as "include" or "have" are intended to specify that a feature, a number, a step, an operation, a component, a part, or a combination thereof described in the specification is present, and do not preclude a possibility of addition or existence of one or more other features or numbers, steps, operations, components, parts, or combinations thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term "about" can mean within one or more standard deviations, or within ±30%, 20%, 10%, 5% of the stated value, for example.

Unless otherwise defined, all terms including technical and scientific terms used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the disclosure will be described with reference to the drawings.

Figure 1B:
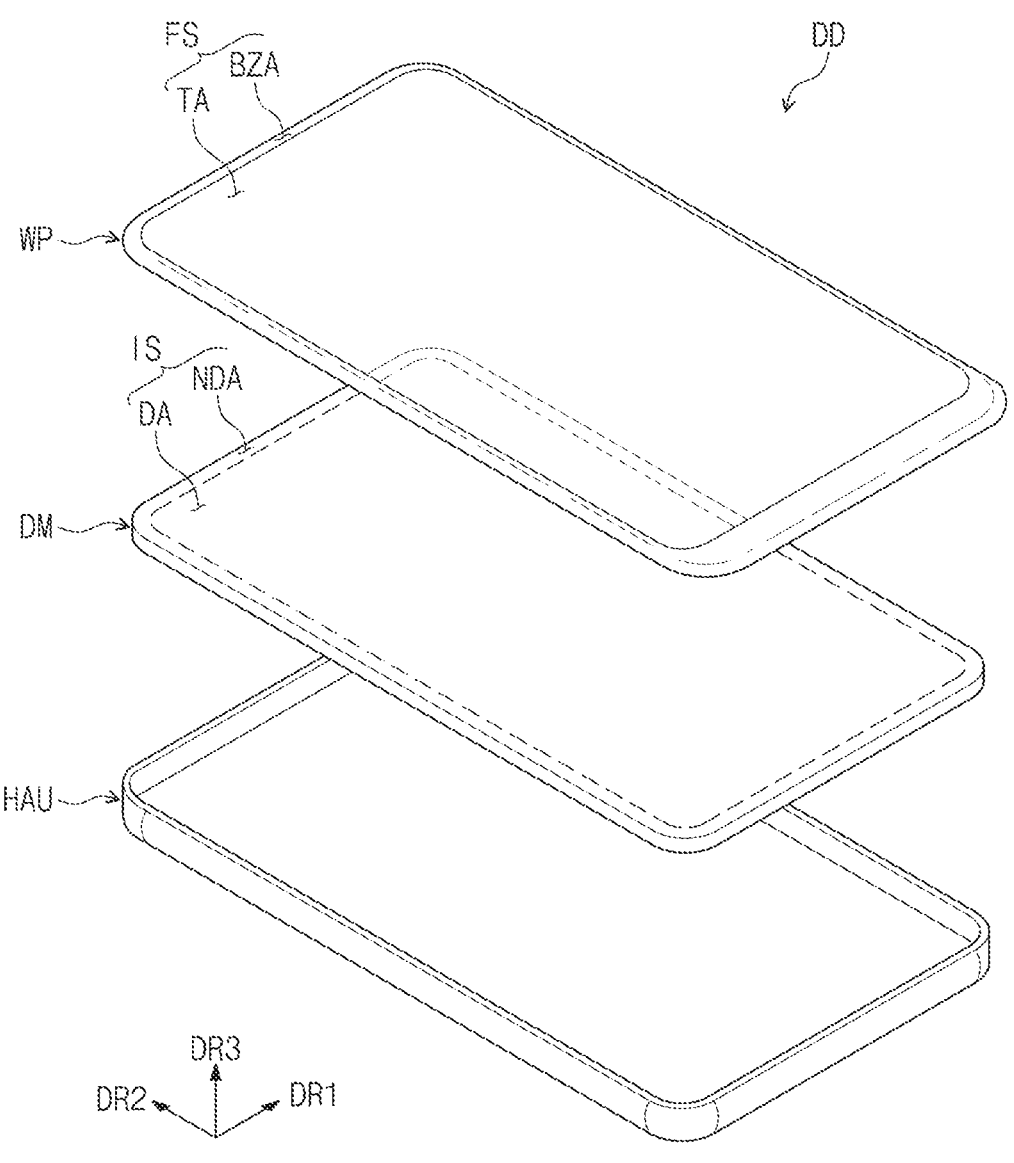
FIG. 1B is an exploded perspective view of an embodiment of a display device according to the disclosure.

FIG. 1A is a perspective view of an embodiment of a display device DD according to the disclosure, and FIG. 1B is an exploded perspective view of an embodiment of the display device DD according to the disclosure.

In an embodiment, the display device DD may be a relatively large electronic device such as a television, a monitor, or an external billboard. Further, the display device DD may be a relatively small and medium-sized electronic device such as a personal computer, a notebook computer, a personal digital assistant, a car navigation unit, a game console, a smartphone, a tablet, and a camera. However, this is an illustrative embodiment. The display device DD may be employed as each of other display devices as long as they do not deviate from the concept of the disclosure. In FIG. 1A and FIG. 1B, an example that the display device DD is a smart phone is illustrated.

Referring to FIGS. 1A and 1B, the display device DD may display an image IM in a third direction DR3 from a display face FS parallel to each of a first direction DR1 and a second direction DR2. The image IM may include a still image as well as a moving image. In FIG. 1A, a clock window and icons are shown in an embodiment of the image IM. The display face FS from which the image IM is displayed may correspond to a front face of the display device DD.

In this embodiment, a front face (or a top face) and a back face (or a bottom face of each of members are defined based on a direction in which the image IM is displayed. The front face and the back face may face each other in the third direction DR3, and a normal direction to each of the front face and the back face may be parallel to the third direction DR3. In an embodiment, directions respectively indicated by the first to third directions DR1, DR2, and DR3 may be of a relative concept and may be exchanged with each other. As used herein, "a plan view" may mean a view in the third direction DR3.

The display device DD may include a window WP, a display module DM, and a housing HAU. The window WP and the housing HAU are combined to each other to form an appearance of the display device DD.

The window WP may include an optically transparent insulating material. In an embodiment, the window WP may include or consist of glass or plastic, for example. A front face of the window WP may define the display face FS of the display device DD. The display face FS may include a transmissive area TA and a bezel area BZA. The transmissive area TA may be an optically transparent area. In an embodiment, the transmissive area TA may be an area having visible light transmittance of about 90% or higher, for example.

The bezel area BZA may be an area having relatively lower light transmittance compared to that of the transmissive area TA. The bezel area BZA may define a shape of the transmissive area TA. The bezel area BZA may be adjacent to the transmissive area TA and may surround the transmissive area TA. However, this is shown by way of example, and the bezel area BZA of the window WP may be omitted. The window WP may include at least one functional layer of an anti-fingerprint layer, a hard coating layer, and an anti-reflective layer. However, the disclosure is not limited to any particular embodiment.

The display module DM may be disposed under the window WP. The display module DM may be a component that actually generates the image IM. The image IM generated by the display module DM may be displayed on a display face IS of the display module DM and may be recognized by a user from an outside through the transmissive area TA.

The display module DM may include a display area DA and a non-display area NDA. The display area DA may be an area activated according to an electrical signal. The non-display area NDA may be adjacent to the display area DA. The non-display area NDA may surround the display area DA. The non-display area NDA is an area covered with the bezel area BZA and cannot be visible to the user from the outside.

The housing HAU may be combined with the window WP. The housing HAU may be combined with the window WP so as to provide a predetermined inner space. The display module DM may be accommodated in the inner space.

The housing HAU may include a material with relatively high rigidity. In an embodiment, the housing HAU may include a plurality of frames and/or plates including glass, plastic, or metal, or any combinations thereof, for example. The housing HAU may stably protect components of the display device DD accommodated in the inner space from external shocks.

Figure 2:
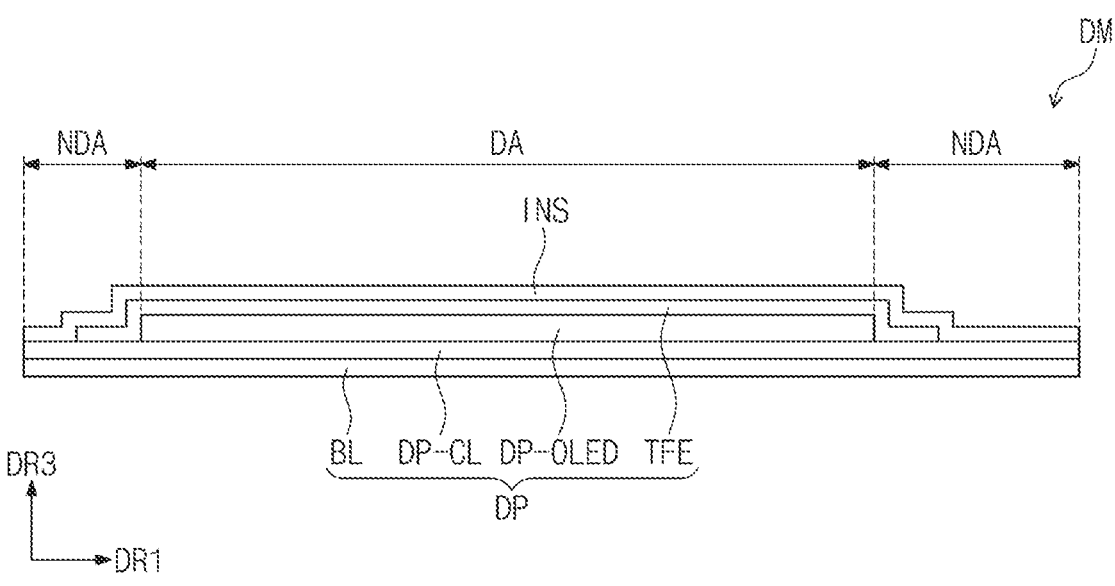
FIG. 2 is a cross-sectional view of an embodiment of a display module according to the disclosure.

FIG. 2 is a cross-sectional view of an embodiment of the display module DM according to the disclosure.

Referring to FIG. 2, the display module DM may include a display panel DP and an input sensor INS. Although not shown separately, the display device DD (refer to FIG. 1A) in an embodiment of the disclosure may further include a protective member disposed on a bottom face of the display panel DP or an anti-reflective member and/or a window member disposed on a top face of the input sensor INS.

The display panel DP may be a light-emitting display panel. However, this is an illustrative embodiment, and the disclosure is not particularly limited thereto. In an embodiment, the display panel DP may be an organic light-emitting display panel or an inorganic light-emitting display panel, for example. A light-emitting layer in the organic light-emitting display panel may include an organic light-emitting material. The light-emitting layer in the inorganic light-emitting display panel may include quantum dots, quantum rods, or micro LEDs. Hereinafter, an embodiment in which the display panel DP is embodied as the organic light-emitting display panel is described.

The display panel DP may include a base layer BL, and a circuit element layer DP-CL, a display element layer DP-OLED, and a thin-film encapsulation layer TFE disposed on the base layer BL. The input sensor INS may be disposed directly on the thin-film encapsulation layer TFE. As used herein, "a component A is directly disposed on a component B" means that an adhesive layer is not disposed between the component A and the component B.

The base layer BL may include at least one plastic film. The base layer BL may be a flexible substrate and may include a plastic substrate, a glass substrate, a metal substrate, or an organic/inorganic composite substrate. A display area DA and a non-display area NDA respectively identical with the display area DA and the non-display area NDA as described in FIG. 1B may be defined in the base layer BL.

The circuit element layer DP-CL may include at least one insulating layer and a circuit element. The insulating layer includes at least one inorganic layer and at least one organic layer. The circuit element includes signal lines, a driving circuit of a pixel, etc.

The display element layer DP-OLED may include a partitioning wall and a light-emitting element. The light-emitting element may include an anode, a middle layer, and a cathode.

The thin-film encapsulation layer TFE may include a plurality of thin-films. Some of the thin-films may be disposed to improve optical efficiency, while some of the thin-films may be further disposed to protect organic light-emitting diodes.

The input sensor INS acquires coordinate information of an external input. The input sensor INS may have a multi-layer structure. The input sensor INS may include a single conductive layer or multiple conductive layers. Further, the input sensor INS may include a single insulating layer or multiple insulating layers. The input sensor INS may detect the external input in a capacitance scheme. However, this is an illustrative embodiment, and the disclosure is not limited thereto. In an embodiment, the input sensor INS may sense the external input in an electromagnetic induction scheme or a pressure detection scheme, for example. In an embodiment, in another embodiment of the disclosure, the input sensor INS may be omitted.

Figure 3:
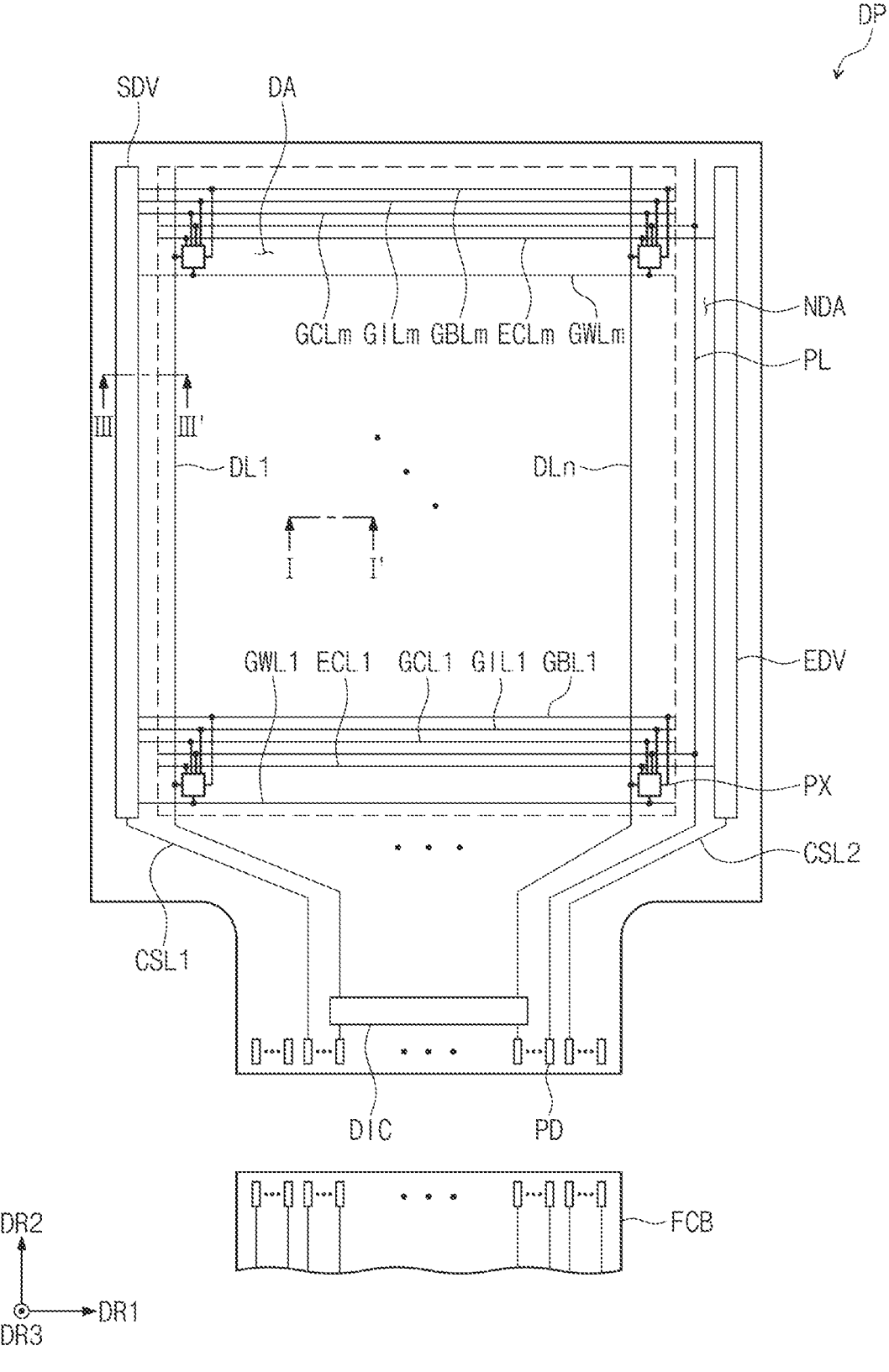
FIG. 3 is a plan view of an embodiment of a display panel according to the disclosure.

FIG. 3 is a plan view of an embodiment of the display panel DP according to the disclosure.

Referring to FIG. 3, the display area DA and the non-display area NDA around the display area DA may be defined in the display panel DP. The display area DA and the non-display area NDA may be distinguished from each other based on whether a pixel PX is present. The pixel PX may be disposed in the display area DA. A scan driver SDV, a data driver, and a light-emission driver EDV may be disposed in the non-display area NDA. The data driver may be a partial circuit included in a driver chip DIC.

The display panel DP may include pixels PX, initialization scan lines GIL1 to GILm, compensation scan lines GCL1 to GCLm, write scan lines GWL1 to GWLm, black scan lines GBL1 to GBLm, light-emission control lines ECL1 to ECLm, data lines DL1 to DLn, first and second control lines CSL1 and CSL2, a driving voltage line PL, and a plurality of pads PD. In this regard, each of m and n is a natural number greater than or equal to 2.

The pixels PX may be connected to the initialization scan lines GIL1 to GILm, the compensation scan lines GCL1 to GCLm, the write scan lines GWL1 to GWLm, the black scan lines GBL1 to GBLm, the light-emission control lines ECL1 to ECLm, and the data lines DL1 to DLn.

The initialization scan lines GIL1 to GILm, the compensation scan lines GCL1 to GCLm, the write scan lines GWL1 to GWLm, and the black scan lines GBL1 to GBLm may extend in the first direction DR1 and may be electrically connected to the scan driver SDV. The data lines DL1 to DLn may extend in the second direction DR2 and may be electrically connected to the driver chip DIC. The light-emission control lines ECL1 to ECLm may extend in the first direction DR1 and may be electrically connected to the light-emission driver EDV.

The driving voltage line PL may include a portion extending in the first direction DR1 and a portion extending in the second direction DR2. The portion extending in the first direction DR1 and the portion extending in the second direction DR2 may be disposed in different layers. The driving voltage line PL may provide a driving voltage to the pixels PX.

The first control line CSL1 may be connected to the scan driver SDV. The second control line CSL2 may be connected to the light-emission driver EDV.

The driver chip DIC, the driving voltage line PL, the first control line CSL1, and the second control line CSL2 may be electrically connected to the pads PD. A flexible circuit film FCB may be electrically connected to the pads PD via an anisotropic conductive adhesive layer. The pads PD may connect the flexible circuit film FCB to the display panel DP. The pads PD may be respectively connected to corresponding pixels PX via the driving voltage line PL, the first control line CSL1, and the second control line CSL2.

Further, the pads PD may further include input pads. The input pads may connect the flexible circuit film FCB to the input sensor INS (refer to FIG. 2). However, the disclosure is not limited thereto, and the input pads may be disposed in the input sensor INS and may be connected to the pads PD and a separate circuit board. In an alternative embodiment, the input sensor INS may be omitted, and the input pads may not be further included.

Figure 4:
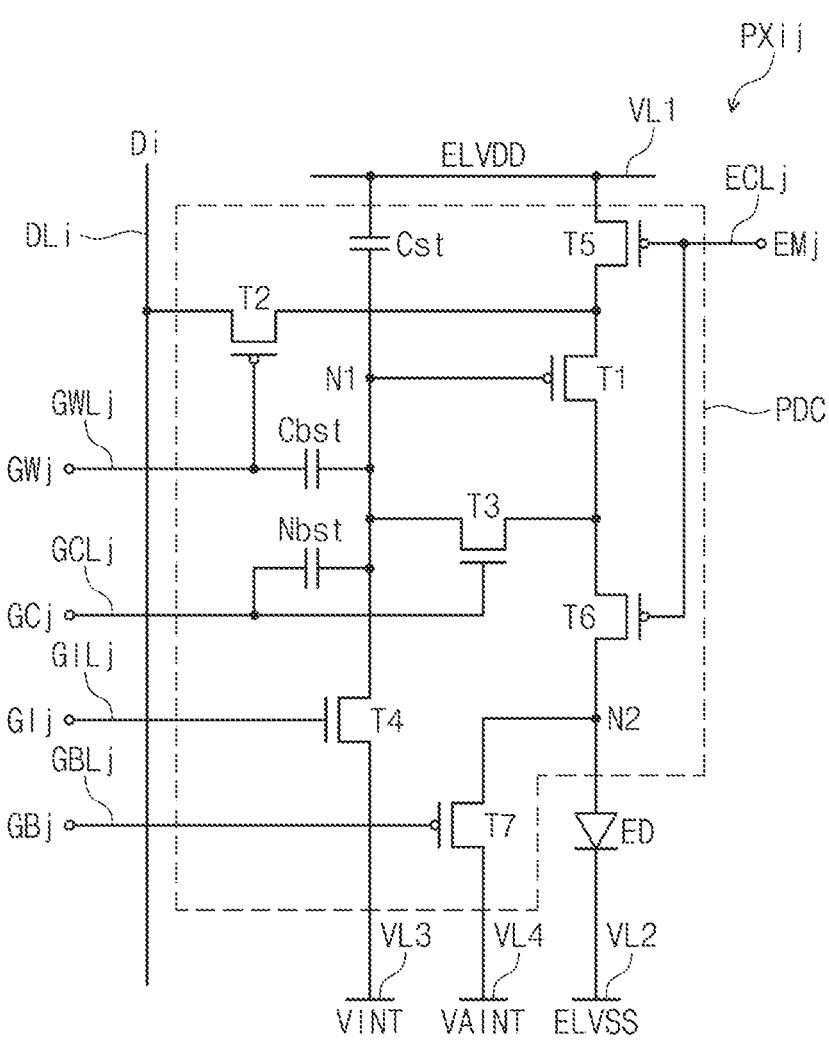
FIG. 4 is an equivalent circuit diagram of an embodiment of a pixel according to the disclosure.

FIG. 4 is an equivalent circuit diagram of an embodiment of a pixel PXij according to the disclosure.

Referring to FIG. 4, an equivalent circuit diagram of one pixel PXij among the plurality of pixels PX (refer to FIG. 3) is shown by way of example. Because the plurality of pixels PX have the same circuit structure, a detailed description of each of the remaining pixels PX is replaced with a description of a circuit structure of the pixel PXij.

Referring to FIG. 3 and FIG. 4, the pixel PXij is connected to an i-th data line DLi among the data lines DL1 to DLn, a j-th initialization scan line GILj among the initialization scan lines GIL1 to GILm, a j-th compensation scan line GCLj among the compensation scan lines GCL1 to GCLm, a j-th write scan line GWLj among the write scan lines GWL1 to GWLm, a j-th black scan line GBLj among the black scan lines GBL1 to GBLm, a j-th light-emission control line ECLj among the light-emission control lines ECL1 to ECLm, first and second driving voltage lines VL1 and VL2, and first and second initialization voltage lines VL3 and VL4. Here, i is an integer greater than or equal to 1 and smaller than or equal to n, and j is an integer greater than or equal to 1 and smaller than or equal to m.

The pixel PXij includes a light-emitting element ED and a pixel circuit PDC. The light-emitting element ED may be a light-emitting diode. In one embodiment of the disclosure, the light-emitting element ED may be an organic light-emitting diode including an organic light-emitting layer. However, the disclosure is not particularly limited thereto. The pixel circuit PDC may control an amount of current flowing in the light-emitting element ED in response to a data signal Di. The light-emitting element ED may emit light at predefined luminance in response to the current amount provided from the pixel circuit PDC.

The pixel circuit PDC may include first to seventh transistors T1, T2, T3, T4, T5, T6, and T7, and the first to third capacitors Cst, Cbst, and Nbst. According to the disclosure, a configuration of the pixel circuit PDC is not limited to the embodiment as shown in FIG. 4. The pixel circuit PDC as shown in FIG. 4 is only an example, and the configuration of the pixel circuit PDC may be implemented in a modified manner.

At least one of the first to seventh transistors T1, T2, T3, T4, T5, T6, and T7 may be a transistor having a low-temperature polycrystalline silicon ("LTPS") semiconductor layer. At least one of the first to seventh transistors T1, T2, T3, T4, T5, T6, and T7 may have an oxide semiconductor layer. In an embodiment, the third and fourth transistors T3 and T4 may be oxide semiconductor transistors, and the first, second, fifth, sixth, and seventh transistors T1, T2, T5, T6, and T7 may be LTPS transistors, for example.

Specifically, the first transistor T1 which directly affects brightness of the light-emitting element ED may include a semiconductor layer composed of highly reliable polycrystalline silicon, and thus, a high-resolution display device may be implemented. In an embodiment, an oxide semiconductor has relatively high carrier mobility and relatively low leakage current. Thus, even when an operation time is large, a voltage drop is not large. That is, because a color change of an image due to a voltage drop is not relatively large even during a low-frequency operation, a low-frequency operation may be realized. In this way, the oxide semiconductor has relatively small leakage current. Thus, at least one of the third transistor T3 or fourth transistor T4 connected to a gate electrode of the first transistor T1 may include the oxide semiconductor, such that leakage current that may flow to the gate electrode may be prevented and at the same time, power consumption may be reduced.

Each of some of the first to seventh transistors T1, T2, T3, T4, T5, T6, and T7 may be a P-type transistor, and each of the remaining ones may be an N-type transistor. In an embodiment, each of the first, second, fifth, sixth, and seventh transistors T1, T2, T5, T6, and T7 may be the P-type transistor, and each of the third and fourth transistors T3 and T4 may be the N-type transistor, for example.

A configuration of the pixel circuit PDC according to the disclosure is not limited to the embodiment as shown in FIG. 4. The pixel circuit PDC as shown in FIG. 4 is only an example, and the configuration of the pixel circuit PDC may be implemented in a modified manner. In an embodiment, all of the first to seventh transistors T1, T2, T3, T4, T5, T6, and T7 may be P-type transistors or N-type transistors, for example. In an alternative embodiment, each of the first, second, fifth, and sixth transistors T1, T2, T5, and T6 may be the P-type transistor, and each of the third, fourth, and seventh transistors T3, T4, and T7 may be the N-type transistor.

The j-th initialization scan line GILj, the j-th compensation scan line GCLj, the j-th write scan line GWLj, the j-th black scan line GBLj and the j-th light-emission control line ECLj may respectively transfer a j-th initialization scan signal GIj, a j-th compensation scan signal GCj, a j-th write scan signal GWj, a j-th black scan signal GBj and a j-th light-emission control signal EMj to the pixel PXij. The i-th data line DLi transfers the i-th data signal Di to the pixel PXij. The i-th data signal Di may have a voltage level corresponding to an image signal input to the display device DD (refer to FIG. 1).

The first and second driving voltage lines VL1 and VL2 may transfer a first driving voltage ELVDD and a second driving voltage ELVSS to the pixel PXij, respectively. Further, the first and second initialization voltage lines VL3 and VL4 may transfer a first initialization voltage VINT and a second initialization voltage VAINT to the pixel PXij, respectively.

The first transistor T1 is connected to and disposed between the first driving voltage line VL1 receiving the first driving voltage ELVDD and the light-emitting element ED. The first transistor T1 includes a first electrode connected to the first driving voltage line VL1 via the fifth transistor T5, a second electrode connected to a pixel electrode (also referred to as an anode) of the light-emitting element ED via the sixth transistor T6, and a third electrode (e.g., a gate electrode) connected to one end (e.g., a first node N1) of the first capacitor Cst. The first transistor T1 may receive the i-th data signal Di transmitted from the i-th data line DLi under a switching operation of the second transistor T2 to supply a drive current to the light-emitting element ED.

The second transistor T2 is connected to and disposed between the data line DLi and the first electrode of the first transistor T1. The second transistor T2 includes a first electrode connected to the data line DLi, a second electrode connected to the first electrode of the first transistor T1, and a third electrode (e.g., a gate electrode) connected to the j-th write scan line GWLj. The second transistor T2 may be turned on based on the write scan signal GWj received from the j-th write scan line GWLj to transmit the i-th data signal Di delivered from the i-th data line DLi to the first electrode of the first transistor T1. One end of the second capacitor Cbst may be connected to the third electrode of the second transistor T2, and the other end of the second capacitor Cbst may be connected to the first node N1.

The third transistor T3 is connected to and disposed between the second electrode of the first transistor T1 and the first node N1. The third transistor T3 includes a first electrode connected to the third electrode of the first transistor T1, a second electrode connected to the second electrode of the first transistor T1, and a third electrode (e.g., a gate electrode) connected to the j-th compensation scan line GCLj. The third transistor T3 may be turned on based on the j-th compensation scan signal GCj received from the j-th compensation scan line GCLj to connect the third electrode of the first transistor T1 and the second electrode of the first transistor T1 to each other such that the first transistor T1 may be conductive in a diode manner. One end of the third capacitor Nbst may be connected to the third electrode of the third transistor T3, and the other end of the third capacitor Nbst may be connected to the first node N1.

The fourth transistor T4 is connected to and disposed between the first node N1 and the first initialization voltage line VL3 to which the first initialization voltage VINT is applied. The fourth transistor T4 includes a first electrode connected to the first initialization voltage line VL3 to which the first initialization voltage VINT is delivered, a second electrode connected to the first node N1, and a third electrode (e.g., a gate electrode) connected to the j-th initialization scan line GILj. The fourth transistor T4 may be turned on based on the j-th initialization scan signal GIj received from the j-th initialization scan line GILj. The turned-on fourth transistor T4 may transfer the first initialization voltage VINT to the first node N1 to initialize a potential (that is, a potential of the first node N1) of the third electrode of the first transistor T1.

The fifth transistor T5 includes a first electrode connected to the first driving voltage line VL1, a second electrode connected to the first electrode of the first transistor T1, and a third electrode (e.g., a gate electrode) connected to the j-th light-emission control line ECLj. The sixth transistor T6 includes a first electrode connected to the second electrode of the first transistor T1, a second electrode (e.g., a second node N2) connected to the first electrode of the light-emitting element ED, and the third electrode (e.g., a gate electrode) connected to the j-th light-emission control line ECLj.

The fifth and sixth transistors T5 and T6 are simultaneously turned on based on the j-th light-emission control signal EMj transmitted from the j-th light-emission control line ECLj. The first driving voltage ELVDD applied via the turned-on fifth transistor T5 may be compensated via the first transistor T1 conductive in the diode manner, and then may be transmitted to the light-emitting element ED via the sixth transistor T6.

The seventh transistor T7 includes a first electrode connected to the second initialization voltage line VL4 to which the second initialization voltage VAINT is transmitted, a second electrode connected to the second electrode of the sixth transistor T6, and a third electrode (e.g., a gate electrode) connected to the black scan line GBLj. The second initialization voltage VAINT may have a voltage level lower than or equal to that of the first initialization voltage VINT.

One end of the first capacitor Cst is connected to the third electrode of the first transistor T1, and the other end of the first capacitor Cst is connected to the first driving voltage line VL1. A cathode of the light-emitting element ED may be connected to the second driving voltage line VL2 delivering the second driving voltage ELVSS. The second driving voltage ELVSS may have a lower voltage level than that of the first driving voltage ELVDD.

Figure 5:
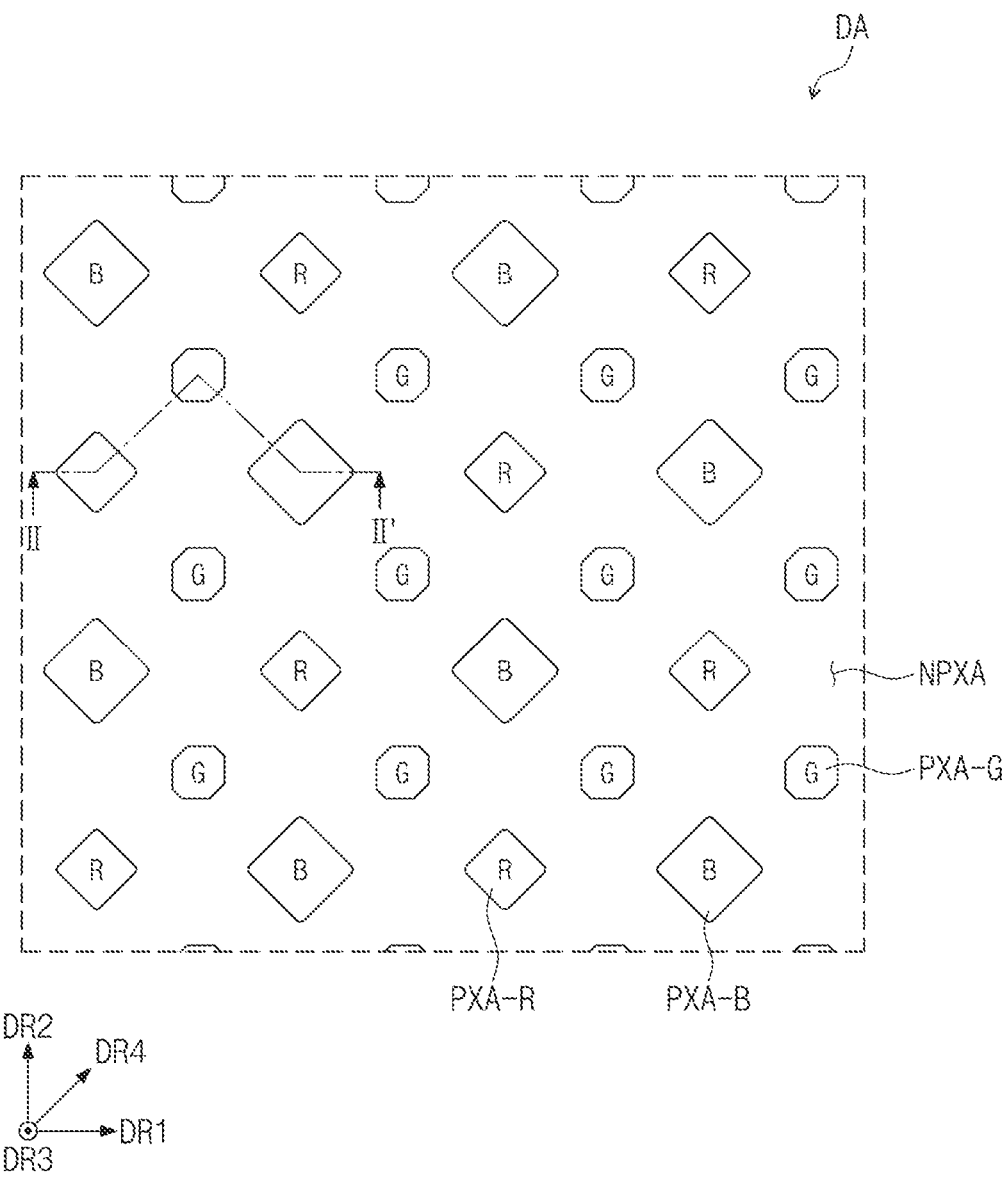
FIG. 5 is an enlarged plan view of an embodiment of a portion of a display area of a display panel according to the disclosure.

FIG. 5 is an enlarged plan view of an embodiment of a portion of the display area DA (refer to FIG. 2) of the display panel DP (refer to FIG. 2) according to the disclosure. FIG. 5 shows a plan view of the display module DM in a direction toward the display face IS (refer to FIG. 1B) of the display module DM (refer to FIG. 1B), and shows an arrangement of light-emitting areas PXA-R, PXA-G, and PXA-B.

Referring to FIG. 5, the display area DA may include the first to third light-emitting areas PXA-R, PXA-G, and PXA-B, and a peripheral area NPXA surrounding the first to third light-emitting areas PXA-R, PXA-G, and PXA-B. The first to third light-emitting areas PXA-R, PXA-G, and PXA-B may respectively correspond to areas from which light beams respectively provided from light-emitting elements ED1, ED2, and ED3 (refer to FIG. 8) are emitted. The first to third light-emitting areas PXA-R, PXA-G, and PXA-B may be distinguished from each other based on a color of light emitted therefrom toward an outside out of the display module DM (refer to FIG. 2).

The first to third light-emitting areas PXA-R, PXA-G, and PXA-B may respectively provide first to third color light beams having different colors. In an embodiment, the first color light may be red light, the second color light may be green light, and the third color light may be blue light, for example. However, an embodiment of the first to third color light beams is not necessarily limited to the above example.

Each of the first to third light-emitting areas PXA-R, PXA-G, and PXA-B may be defined as an area in which a top face of the anode is exposed through a light-emitting opening, which will be described later. The peripheral area NPXA may define a boundary of each of the first to third light-emitting areas PXA-R, PXA-G, and PXA-B, and may prevent color mixing between the first to third light-emitting areas PXA-R, PXA-G, and PXA-B.

Each of the first to third light-emitting areas PXA-R, PXA-G, and PXA-B may include a plurality of light-emitting areas which may be repeatedly arranged in a predetermined arrangement rule in the display area DA. In an embodiment, the first and third light-emitting areas PXA-R and PXA-B may be alternately arranged with each other along the first direction DR1 to constitute 'a first group', for example. The second light-emitting areas PXA-G may be arranged along the first direction DR1 to constitute 'a second group'. Each of 'the first group' and 'the second group' may include a plurality of groups. 'The first groups' and 'the second groups' may be alternately arranged with each other along the second direction DR2.

One second light-emitting area PXA-G may be spaced apart from one first light-emitting area PXA-R or one third light-emitting area PXA-B in a fourth direction DR4. The fourth direction DR4 may be defined as a direction between the first and second directions DR1 and DR2.

In an embodiment, FIG. 5 shows an arrangement form of the first to third light-emitting areas PXA-R, PXA-G, and PXA-B by way of example. However, the disclosure is not limited thereto, and the first to third light-emitting areas PXA-R, PXA-G, and PXA-B may be arranged in various arrangement forms. In an embodiment, the first to third light-emitting areas PXA-R, PXA-G and PXA-B may be arranged in a PENTILE™ arrangement form as shown in FIG. 5. In an alternative embodiment, the first to third light-emitting areas PXA-R, PXA-G, and PXA-B may be arranged in a stripe arrangement form or a Diamond Pixel arrangement form.

The first to third light-emitting areas PXA-R, PXA-G, and PXA-B may have various shapes in a plan view. In an embodiment, the first to third light-emitting areas PXA-R, PXA-G, and PXA-B may have polygonal, circular, or elliptical shapes, for example. FIG. 5 shows an embodiment in which each of the first and third light-emitting areas PXA-R and PXA-B has a quadrangular, e.g., rectangular shape (or a rhombus shape) and the second light-emitting area PXA-G has an octagonal shape in a plan view.

The first to third light-emitting areas PXA-R, PXA-G, and PXA-B may have the same shape in a plan view, or at least some thereof may have different shapes in the plan view. FIG. 5 shows an embodiment in which the first and third light-emitting areas PXA-R and PXA-B have the same shape as each other in a plan view, and the second light-emitting area PXA-G has a shape different from the shape of each of the first and third light-emitting areas PXA-R and PXA-B.

At least some of the first to third light-emitting areas PXA-R, PXA-G, and PXA-B may have area sizes different from each other in a plan view. In an embodiment, the area size of the first light-emitting area PXA-R emitting red light may be larger than the area size of the second light-emitting area PXA-G emitting green light and may be smaller than the area size of the third light-emitting area PXA-B emitting blue light. However, a relationship between the area sizes of the first to third light-emitting areas PXA-R, PXA-G, and PXA-B according to a color of light emitted therefrom is not limited thereto. According to a design of the display module DM (refer to FIG. 2), the relationship between the area sizes of the first to third light-emitting areas PXA-R, PXA-G, and PXA-B may vary. Further, the disclosure is not limited thereto, and the first to third light-emitting areas PXA-R, PXA-G, and PXA-B may have the same area size in a plan view.

In an embodiment, the shapes, the area sizes, the arrangement, etc., of the first to third light-emitting areas PXA-R, PXA-G, and PXA-B of the display module DM (refer to FIG. 2) according to the disclosure may be designed in various ways, based on the color of light emitted therefrom, or a size or a configuration of the display module DM (refer to FIG. 2). The disclosure is not limited to the embodiment as shown in FIG. 5.

Figure 6:
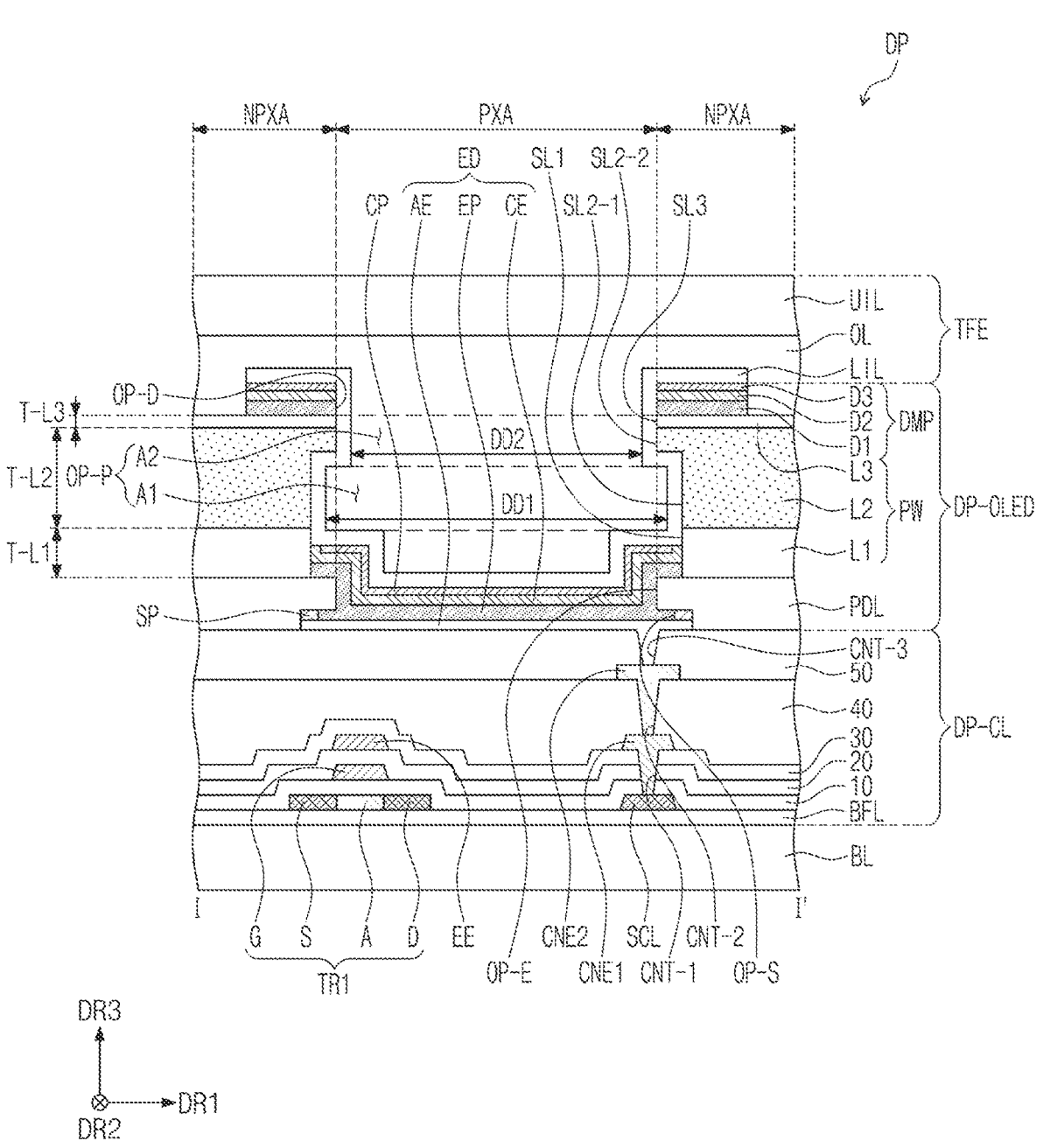
FIG. 6 is a cross-sectional view of an embodiment of a display panel according to the disclosure taken along line I-I' of FIG. 3.

FIG. 6 is a cross-sectional view of an embodiment of the display panel according to the disclosure as taken along line of FIG. 3. In describing FIG. 6, the description will be made together with reference to FIG. 2, and descriptions about the components having the same reference numerals as those in FIG. 2 will be omitted.

FIG. 6 is an enlarged view of one light-emitting area PXA in the display area DA (refer to FIG. 3), and the light-emitting area PXA in FIG. 6 may correspond to one of the first to third light-emitting areas PXA-R, PXA-G, and PXA-B in FIG. 5.

Referring to FIG. 6, the display panel DP may include the base layer BL, the circuit element layer DP-CL, the display element layer DP-OLED, and the thin-film encapsulation layer TFE.

The display panel DP may include a plurality of insulating layers, a semiconductor pattern, a conductive pattern, a signal line, etc. An insulating layer, a semiconductor layer, and a conductive layer are formed using a coating or deposition scheme, for example. Thereafter, the insulating layer, the semiconductor layer, and the conductive layer may be selectively patterned using photolithography and etching. In this way, the semiconductor pattern, the conductive pattern, the signal line, etc. included in the circuit element layer DP-CL and the display element layer DP-OLED may be formed.

The circuit element layer DP-CL may be disposed on the base layer BL. The circuit element layer DP-CL may include a buffer layer BFL, a transistor TR1, a signal transfer area SCL, first to fifth insulating layers 10, 20, 30, 40, and 50, an electrode EE, and a plurality of connection electrodes CNE1 and CNE2.

The buffer layer BFL may be disposed on the base layer BL. The buffer layer BFL may improve a coupling force between the base layer BL and the semiconductor pattern. The buffer layer BFL may include a silicon oxide layer and a silicon nitride layer. The silicon oxide layers and the silicon nitride layers may be alternately stacked with each other.

The semiconductor pattern may be disposed on the buffer layer BFL. The semiconductor pattern may include poly-silicon. However, the disclosure is not limited thereto, and the semiconductor pattern may include amorphous silicon or metal oxide. FIG. 6 only shows a portion of the semiconductor pattern by way of example. However, the disclosure is not limited thereto. The semiconductor pattern may be further disposed in each of the plurality of light-emitting areas PXA-R, PXA-G, and PXA-B (refer to FIG. 5). The semiconductor patterns may be arranged in a predetermined arrangement rule across the plurality of light-emitting areas PXA-R, PXA-G, and PXA-B. The semiconductor pattern may have electrical properties varying depending on whether it is doped or not with dopants. The semiconductor pattern may include a first area having a relatively high doping concentration and a second area having a relatively low doping concentration. The first area may be doped with an N-type dopant or a P-type dopant. A P-type transistor may include the first area doped with the P-type dopant.

The first area has higher conductivity than that of the second area, and substantially serves as an electrode or a signal line. The second area may actually act as an active area (or a channel) of a transistor. In other words, a portion of the semiconductor pattern may be the active area of the transistor, another portion thereof may be a source or a drain of the transistor, and still another portion thereof may be a conductive area.

A source S, an active area A, and a drain D of the transistor TR1 may be formed from the semiconductor pattern. FIG. 6 shows a portion of the signal transfer area SCL formed from the semiconductor pattern. Although not separately shown, the signal transfer area SCL may be connected to the drain D of the transistor TR1 in a plan view.

The first to fifth insulating layers 10, 20, 30, 40, and 50 may be disposed on the buffer layer BFL. Each of the first to fifth insulating layers 10, 20, 30, 40, and 50 may be an inorganic layer or an organic layer.

The first insulating layer 10 may be disposed on the buffer layer BFL. The first insulating layer 10 may cover the source S, the active area A, and the drain D of the transistor TR1, and the signal transfer area SCL disposed on the buffer layer BFL. A gate G of the transistor TR1 may be disposed on the first insulating layer 10. The second insulating layer 20 may be disposed on the first insulating layer 10 so as to cover the gate G. The electrode EE may be disposed on the second insulating layer 20. The third insulating layer 30 may be disposed on the second insulating layer 20 so as to cover the electrode EE.

The first connection electrode CNE1 may be disposed on the third insulating layer 30. The first connection electrode CNE1 may be connected to the signal transfer area SCL via a contact-hole CNT-1 defined through the first to third insulating layers 10, 20, and 30. The fourth insulating layer 40 may be disposed on the third insulating layer 30 so as to cover the first connection electrode CNE1. The fourth insulating layer 40 may be an organic layer.

The second connection electrode CNE2 may be disposed on the fourth insulating layer 40. The second connection electrode CNE2 may be connected to the first connection electrode CNE1 via a contact-hole CNT-2 defined through the fourth insulating layer 40. The fifth insulating layer 50 may be disposed on the fourth insulating layer 40 so as to cover the second connection electrode CNE2. The fifth insulating layer 50 may be an organic layer.

The display element layer DP-OLED may be disposed on the circuit element layer DP-CL. The display element layer DP-OLED may include the light-emitting element ED, a sacrificial pattern SP, a pixel defining film PDL, a partitioning wall PW, and dummy patterns DMP.

The light-emitting element ED may include an anode AE (or a first electrode), a light-emitting pattern EP, and a cathode CE (or a second electrode). Each of the first to third light-emitting elements ED1, ED2, and ED3 to be described below may include substantially the same configuration as that of the light-emitting element ED of FIG. 6. Descriptions about the anode AE, the light-emitting pattern EP, and the cathode CE may equally be applied to the anode, the light-emitting pattern, and the cathode of each of the first to third light-emitting elements, which will be described later.

The anode AE may be disposed on the fifth insulating layer 50 of the circuit element layer DP-CL. The anode AE may be a transmissive electrode, a transflective electrode, or a reflective electrode. The anode AE may be connected to the second connection electrode CNE2 via a contact-hole CNT-3 defined through the fifth insulating layer 50. Therefore, the anode AE may be electrically connected to the signal transfer area SCL via the first and second connection electrodes CNE1 and CNE2, and thus may be electrically connected to a corresponding circuit element. The anode AE may include a single layer or multi-layer structure. The anode AE may include a plurality of layers respectively including indium tin oxide ("ITO") and Ag.

In an embodiment, the anode AE may include a layer (hereinafter, a lower ITO layer) including ITO, a layer (hereinafter, an Ag layer) including Ag and disposed on the lower ITO layer, and a layer (hereinafter, an upper ITO layer) including ITO and disposed on the Ag layer, for example.

The sacrificial pattern SP may be disposed between the anode AE and the pixel defining film PDL. In the sacrificial pattern SP, a sacrificial opening OP-S exposing a portion of a top face of the anode AE may be defined. The sacrificial opening OP-S may overlap with a light-emitting opening OP-E as described later. The sacrificial pattern SP may include an amorphous transparent conductive oxide. The sacrificial pattern SP may include an azo compound. In an embodiment, the sacrificial pattern SP may include or consist of aluminum (Al)-doped zinc oxide ($ZnO_x$), for example. In this regard, a content of aluminum (Al) may be in a range of about 2 at % to about 5 at %.

The pixel defining film PDL may be disposed on the fifth insulating layer 50 of the circuit element layer DP-CL. The light-emitting opening OP-E may be defined in the pixel defining film PDL. The light-emitting opening OP-E may correspond to the anode AE, and at least a portion of the anode AE may be exposed through the light-emitting opening OP-E defined in the pixel defining film PDL.

Further, the light-emitting opening OP-E may correspond to the sacrificial opening OP-S of the sacrificial pattern SP. According to this embodiment, the top face of the anode AE may be spaced apart from the pixel defining film PDL in a cross-sectional view while the sacrificial pattern SP is interposed therebetween. Accordingly, the anode AE may be prevented from damage in a process of defining the light-emitting opening OP-E.

In a plan view, an area size of the light-emitting opening OP-E may be smaller than an area size of the sacrificial opening OP-S. That is, an inner side face of the pixel defining film PDL defining the light-emitting opening OP-E may be closer to a center of the anode AE than an inner side face of the sacrificial pattern SP defining the sacrificial opening OP-S may be. However, the disclosure is not limited thereto, and the inner side face of the sacrificial pattern SP defining the sacrificial opening OP-S may be substantially aligned with the inner side face of the pixel defining film PDL defining the corresponding light-emitting opening OP-E. In this regard, the light-emitting area PXA may correspond to an area of the anode AE exposed through a corresponding sacrificial opening OP-S.

The pixel defining film PDL may include an inorganic insulation material. In an embodiment, the pixel defining film PDL may include silicon nitride $SiN_x$, for example. The pixel defining film PDL may be disposed between the anode AE and the partitioning wall PW so as to prevent electrical connection between the anode AE and the partitioning wall PW.

The partitioning wall PW may be disposed on the pixel defining film PDL. A partitioning wall opening OP-P may be defined in the partitioning wall PW. The partitioning wall opening OP-P may correspond to the light-emitting opening OP-E and may expose at least a portion of the anode AE.

The partitioning wall PW may have an undercut shape in a cross-sectional view. The partitioning wall PW may include multiple layers stacked sequentially, and at least one of the multiple layers may be depressed relative to other layers thereof. Accordingly, the partitioning wall PW may include a tip.

The partitioning wall PW may include a first partitioning wall layer L1, a second partitioning wall layer L2, and a third partitioning wall layer L3. The first partitioning wall layer L1 and a portion of the second partitioning wall layer L2 may be relatively depressed as to extend outwardly of the light-emitting area PXA while the other portion of the second partitioning wall layer L2 and the third partitioning wall layer L3 may not be depressed. That is, the first partitioning wall layer L1 and the portion of the second partitioning wall layer L2 may be undercut relative to the other portion of the second partitioning wall layer L2 and the third partitioning wall layer L3.

In FIG. 6, it is shown that the first partitioning wall layer L1 and the portion of the second partitioning wall layer L2 is etched such that the other portion of the second partitioning wall layer L2 and the third partitioning wall layer L3 constitute the tip of the partitioning wall PW in an illustrative embodiment. However, the disclosure is not limited thereto. In an embodiment, only the first partitioning wall layer L1 may be etched so that the second partitioning wall layer L2 and the third partitioning wall layer L3 may constitute the tip, for example. In an alternative embodiment, the first partitioning wall layer L1 and the second partitioning wall layer L2 may be etched such that only the third partitioning wall layer L3 may constitute the tip.

The partitioning wall opening OP-P defined in the partitioning wall PW may include a first area A1 and a second area A2. The first partitioning wall layer L1 may include a first inner side face SL1 defining a portion of the first area A1 of the partitioning wall opening OP-P, while the second partitioning wall layer L2 may include a second-first inner side face SL2-1 defining the other portion of the first area A1, and a second-second inner side face SL2-2 defining a portion of the second area A2. The third partitioning wall layer L3 may include a third inner side face SL3 defining the other portion of the second area A2.

The first inner side face SL1 of the first partitioning wall layer L1 and the second-first inner side face SL2-1 of the second partitioning wall layer L2 may be relatively depressed inwardly so as to extend outwardly of the light-emitting area PXA while the second-second inner side face SL2-2 of the second partitioning wall layer L2 and the third inner side face SL3 of the third partitioning wall layer L3 may not be depressed. A portion of the second partitioning wall layer L2 and the third partitioning wall layer L3 protruding toward the light-emitting area PXA may constitute the tip.

A width DD1 of the first area A1 may be different from a width DD2 of the second area A2. The width DD1 of the first area A1 may be greater than width DD2 of the second area A2. In this case, the second area A2 of the partitioning wall opening OP-P may be an area defining the tip.

The first partitioning wall layer L1 may be disposed on the pixel defining film PDL. The first partitioning wall layer L1 may include a conductive material. In an embodiment, the first partitioning wall layer L1 may include indium zinc oxide ("IZO"), for example. A mass fraction of an oxide in the indium zinc oxide included in the first partitioning wall layer L1 may be about 10 wt %.

The first partitioning wall layer L1 including indium zinc oxide is less affected by moisture remaining in the structure disposed under the first partitioning wall layer L1. Thus, a spot defect phenomenon that may occur in a formation process of the first partitioning wall layer L1 after cleaning may be reduced or eliminated. Further, indium zinc oxide may have amorphous properties at a temperature equal to or lower than about 400 degrees Celsius. Therefore, since amorphous indium zinc oxide may be deposited at room temperature, difficulty in forming the partitioning wall PW may be reduced. A thickness T-L1 of the first partitioning wall layer L1 may be in a range of about 1000 angstroms to about 2500 angstroms.

According to the disclosure, the first partitioning wall layer L1 includes indium zinc oxide, such that the cathode CE may contact the inner side face of the first partitioning wall layer L1 and may receive the second driving voltage ELVSS (refer to FIG. 3B). Further, as the first partitioning wall layer L1 includes indium zinc oxide, the first partitioning wall layer L1 may have a relatively high reduction potential. Accordingly, a phenomenon in which an oxide film is formed on the first partitioning wall layer L1 such that electrical resistance increases in a contact area between the first partitioning wall layer L1 and the cathode CE may be reduced or eliminated.

However, this is an illustrative embodiment, and a material constituting the first partitioning wall layer L1 is not limited thereto. In an embodiment, the first partitioning wall layer L1 may include room temperature amorphous ITO using moisture, for example. Even in this case, the spot defect phenomenon occurring in the process of forming the first partitioning wall layer L1 after cleaning may be reduced or eliminated.

The second partitioning wall layer L2 may be disposed on the first partitioning wall layer L1. The second partitioning wall layer L2 may include molybdenum tantalum alloy oxide. In an embodiment, the molybdenum tantalum alloy oxide may be a molybdenum (Mo)-based alloy oxide doped with tantalum, for example. A thickness T-L2 of the second partitioning wall layer L2 may be in a range of about 4000 angstroms to about 5000 angstroms.

TABLE 1

| | Thickness of molybdenum tantalum alloy oxide | | | |
| --- | --- | --- | --- | --- |
| | 1000 angstroms | 3000 angstroms | 4000 angstroms | 5000 angstroms |
| Transmittance | 22.2% | 1.7% | 0.5% | 0.1% |

Figure 7:
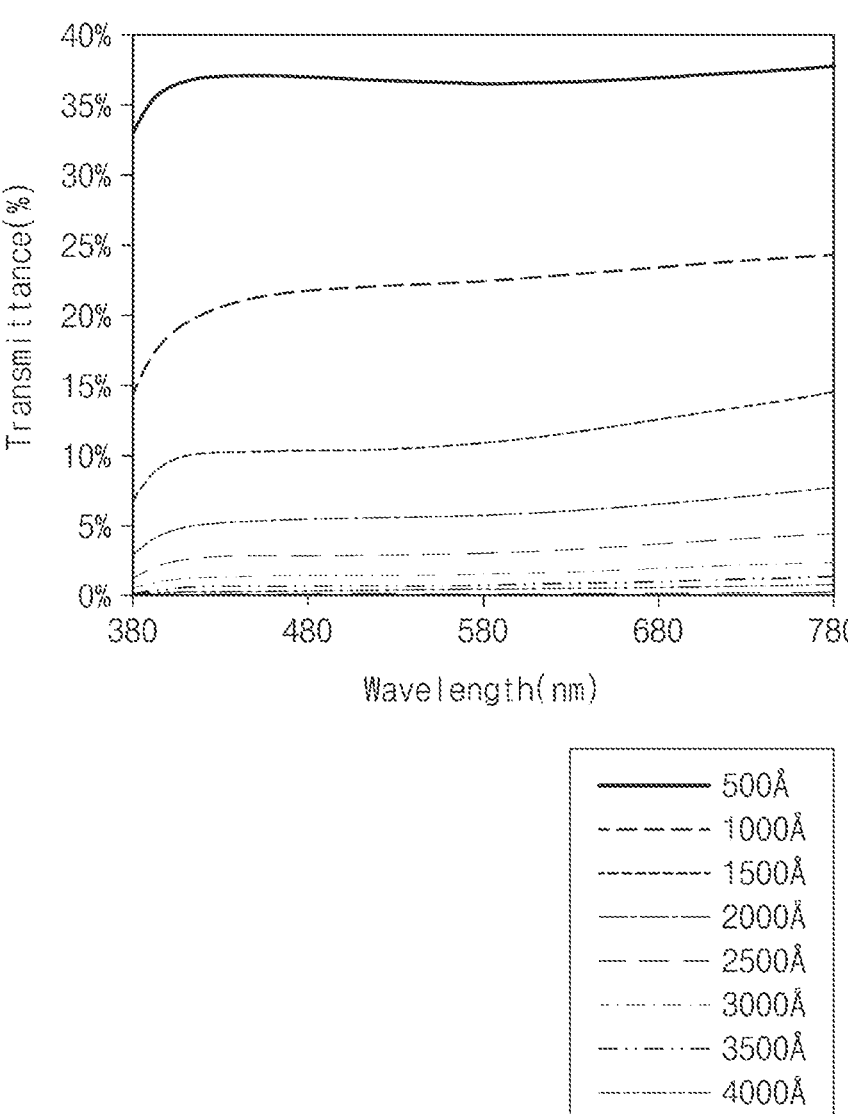
FIG. 7 is a graph showing transmittance of light based on a varying thickness of a molybdenum tantalum alloy oxide.

Table 1 and FIG. 7 are result values and a graph obtained by testing light transmittance based on a varying thickness of the molybdenum-tantalum alloy oxide. Referring to Table 1, FIG. 6, and FIG. 7, when the thickness of the molybdenum-tantalum alloy oxide is about 4000 angstroms or larger, the molybdenum-tantalum alloy oxide may absorb light such that the light transmittance thereof may be smaller than about 0.5%. As the first partitioning wall layer L1 includes transparent indium zinc oxide, the first to third color light beams with different colors as respectively emitted from first to third light-emitting patterns EP1, EP2, and EP3 (refer to FIG. 8) may be mixed with each other. However, when the thickness T-L2 of the second partitioning wall layer L2 including the molybdenum-tantalum alloy oxide is greater than or equal to about 4000 angstroms, the first to third color light beams with different colors as respectively emitted from first to third light-emitting patterns EP1, EP2, and EP3 (refer to FIG. 8) may be prevented from being mixed with each other. When the thickness T-L2 of the second partitioning wall layer L2 is smaller than or equal to about 5000 angstroms, a thickness of the display device DD (refer to FIG. 1A) may be reduced while the first to third color light beams with different colors as respectively emitted from first to third light-emitting patterns EP1, EP2, and EP3 (refer to FIG. 8) may be prevented from being mixed with each other. The thickness T-L2 of the second partitioning wall layer L2 may be in a range of about 4000 angstroms to about 5000 angstroms, and in this case, the transmittance of the second partitioning wall layer L2 may be about 0.5% or smaller.

Referring back to FIG. 6, the third partitioning wall layer L3 may be disposed on the second partitioning wall layer L2. The third partitioning wall layer L3 may constitute the topmost face of the partitioning wall PW and may constitute the topmost face of the tip of the partitioning wall PW. The third partitioning wall layer L3 may include aluminum oxide (AlO$_x$). The third partitioning wall layer L3 may include a material having a Young's modulus of about 300 gigapascals (GPa) or greater. The third partitioning wall layer L3 includes aluminum oxide having a relatively large Young's Modulus such that deformation of the third partitioning wall layer L3 may be reduced. As the deformation of the third partitioning wall layer L3 constituting the topmost face of the tip decreases, robustness of the undercut structure of the partitioning wall PW may increase. Accordingly, a shape in which the tip of the partitioning wall PW sags may be reduced or eliminated, and a shape in which the tip blocks the inner side face of the partitioning wall PW contacting the cathode CE may be reduced or eliminated. A thickness T-L3 of the third partitioning wall layer L3 may be in a range of 500 angstroms to 1000 angstroms.

In FIG. 6, it is shown that each of the first inner side face SL1, the second-first inner side face SL2-1, the second-second inner side face SL2-2, and the third inner side face SL3 is perpendicular to a top face of the pixel defining film PDL in an illustrative embodiment. However, the disclosure is not limited thereto. In an embodiment, the partitioning wall PW may have a tapered shape or an inverted tapered shape, for example.

The light-emitting pattern EP may be disposed on the anode AE. The light-emitting pattern EP may include a light-emitting layer including a light-emitting material. The light-emitting pattern EP may further include a hole injection layer ("HIL") and a hole transport layer ("HTL") disposed between the anode AE and the light-emitting layer, and may further include an electron transport layer ("ETL") and an electron injection layer ("EIL") disposed on the light-emitting layer. The light-emitting pattern EP may be also referred to as an 'organic layer' or a 'middle layer'.

The light-emitting pattern EP may be patterned along the tip defined in the partitioning wall PW. The light-emitting pattern EP may be disposed in the sacrificial opening OP-S, the light-emitting opening OP-E, and the partitioning wall opening OP-P. The light-emitting pattern EP may cover a portion of the top face of the pixel defining film PDL exposed through the partitioning wall opening OP-P.

The cathode CE may be disposed on the light-emitting pattern EP. The cathode CE may be patterned along the tip defined in the partitioning wall PW. The cathode CE may contact the first inner side face SL1 of the first partitioning wall layer L1.

The partitioning wall PW may receive the second driving voltage ELVSS (refer to FIG. 3B). Accordingly, the cathode CE may be electrically connected to the partitioning wall PW and may receive the second driving voltage ELVSS (refer to FIG. 3B) therefrom.

FIG. 6 shows an illustrative embodiment in which the light-emitting pattern EP contact the first inner side face SL1 of the first partitioning wall layer L1. However, the disclosure is not limited thereto. In an embodiment, the light-emitting pattern EP may not contact the first inner side face SL1 of the first partitioning wall layer L1, for example.

In an embodiment of the disclosure, the display panel DP may further include a capping pattern CP. The capping pattern CP may be disposed within the partitioning wall opening OP-P and may be disposed on the cathode CE. The capping pattern CP may be patterned along the tip formed in the partitioning wall PW. FIG. 6 shows by way example that the capping pattern CP does not contact the first inner side face SL1 of the first partitioning wall layer L1. However, the disclosure is not limited thereto. In an embodiment, the capping pattern CP may be formed to contact the first inner side face SL1 of the first partitioning wall layer L1, for example. In another embodiment, in another embodiment of the disclosure, the capping pattern CP may be omitted.

The dummy patterns DMP may be disposed on the partitioning wall PW. The dummy patterns DMP may include a first dummy pattern D1, a second dummy pattern D2, and a third dummy pattern D3. The first to third dummy patterns D1, D2, and D3 may be sequentially stacked along the third direction DR3 on a top face of the third partitioning wall layer L3 of the partitioning wall PW.

The first dummy pattern D1 may include an organic material. In an embodiment, the first dummy pattern D1 may include the same material as that of the light-emitting pattern EP, for example. The first dummy pattern D1 may be simultaneously formed with formation of the light-emitting pattern EP in one process, or may be formed separately from the formation of the light-emitting pattern EP due to the undercut shape of the partitioning wall PW.

The second dummy pattern D2 may include a conductive material. In an embodiment, the second dummy pattern D2 may include the same material as that of the cathode CE, for example. The second dummy pattern D2 may be formed simultaneously with formation of the cathode CE in one process, or may be formed separately from the formation of the cathode CE due to the undercut shape of the partitioning wall PW.

The third dummy pattern D3 may include the same material as that of the capping pattern CP. The third dummy pattern D3 may be formed simultaneously with formation of the capping pattern CP in one process, or may be formed separately from the formation of the capping pattern CP due to the undercut shape of the partitioning wall PW.

A dummy opening OP-D may be defined in the dummy patterns DMP. The dummy opening OP-D may correspond to the light-emitting opening OP-E. The dummy opening OP-D may include first to third areas AA1, AA2, and AA3 which are sequentially arranged in the third direction DR3 (refer to FIG. 10J). The first area AA1 of the dummy opening OP-D may be defined by an inner side face of the first dummy pattern D1, the second area AA2 thereof may be defined by an inner side face of the second dummy pattern D2, and the third area AA3 thereof may be defined by an inner side face of the third dummy pattern D3. In a plan view, each of the first to third dummy patterns D1, D2, and D3 may have a closed-line shape enclosing the light-emitting area PXA.

FIG. 6 shows an illustrative embodiment that the inner side faces of the first to third dummy patterns D1, D2, and D3 are aligned with the third inner side face SL3 of the third partitioning wall layer L3. However, the disclosure is not limited thereto. The first to third dummy patterns D1, D2, and D3 may cover the third inner side face SL3 of the third partitioning wall layer L3.

The thin-film encapsulation layer TFE may be disposed on the display element layer DP-OLED. The thin-film encapsulation layer TFE may include a lower encapsulation inorganic pattern LIL, an encapsulation organic film OL, and an upper encapsulation inorganic film UIL.

The lower encapsulation inorganic pattern LIL may correspond to the light-emitting opening OP-E. The lower encapsulation inorganic pattern LIL may cover the light-emitting element ED and the dummy patterns DMP. A portion of the lower encapsulation inorganic pattern LIL may be disposed in the partitioning wall opening OP-P. In an embodiment, the lower encapsulation inorganic pattern LIL may contact the first inner side face SL1 of the first partitioning wall layer L1.

The encapsulation organic film OL may cover the lower encapsulation inorganic pattern LIL and may provide a flat top face. The upper encapsulation inorganic film UIL may be disposed on the encapsulation organic film OL.

The lower encapsulation inorganic pattern LIL and the upper encapsulation inorganic film UIL may protect the display element layer DP-OLED from moisture/oxygen, while the encapsulation organic film OL may protect the display element layer DP-OLED from a foreign substance such as dust particles.

Figure 8:
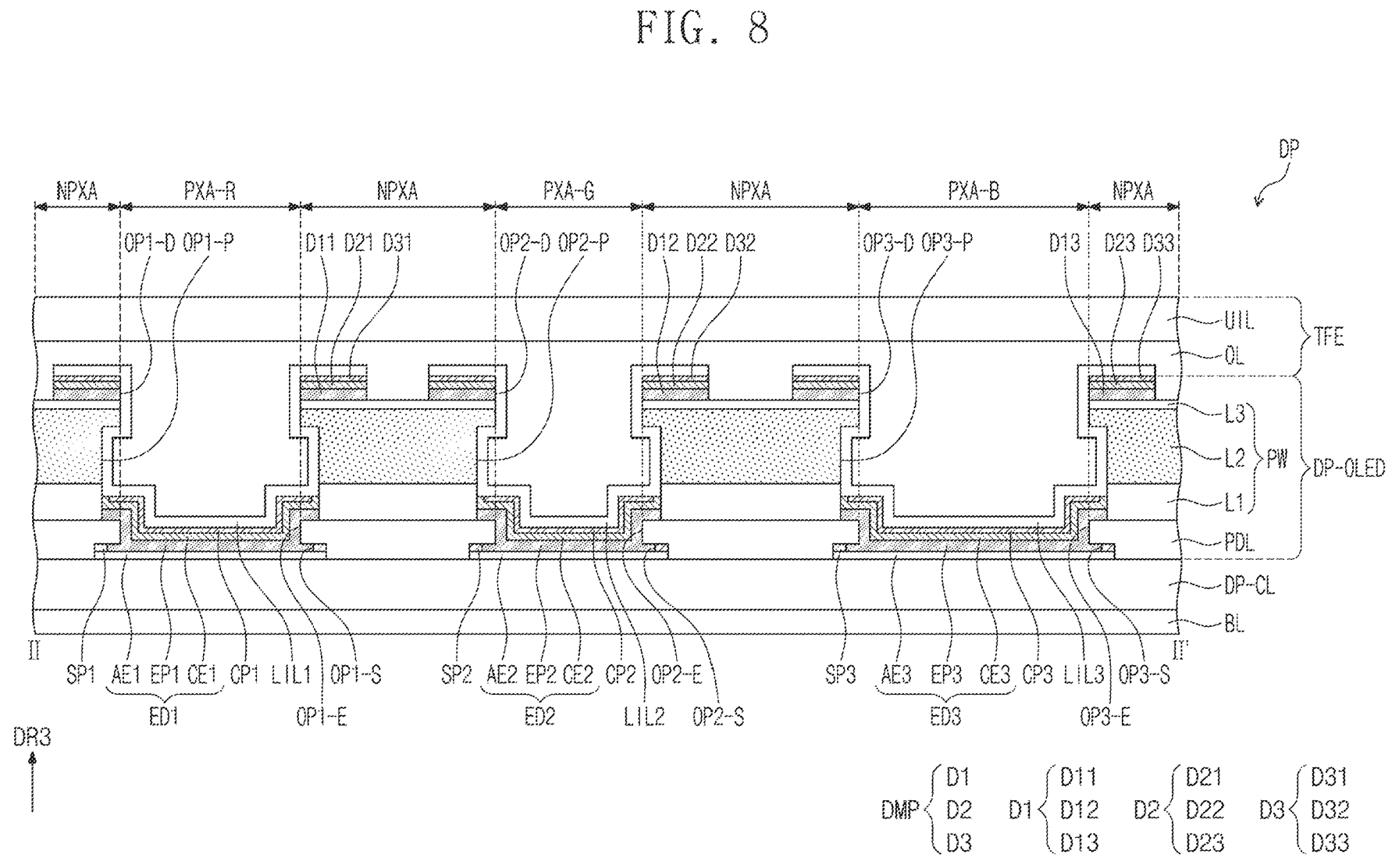

FIG. 8 is a cross-sectional view taken along line II-II' of FIG. 5. FIG. 8 is an enlarged view of one first light-emitting area PXA-R, one second light-emitting area PXA-G, and one third light-emitting area PXA-B. The description about one light-emitting area PXA in FIG. 6 may be equally applied to each of the first to third light-emitting areas PXA-R, PXA-G, and PXA-B.

Referring to FIG. 8, the display panel DP according to this embodiment may include the base layer BL, the circuit element layer DP-CL, the display element layer DP-OLED, and the thin-film encapsulation layer TFE. The display element layer DP-OLED may include the first to third light-emitting elements ED1, ED2, and ED3, sacrificial patterns SP1, SP2, and SP3, the pixel defining film PDL, the partitioning wall PW, and the dummy patterns DMP.

The first to third light-emitting elements ED1, ED2, and ED3 may include the first light-emitting element ED1, the second light-emitting element ED2, and the third light-emitting element ED3. The first light-emitting element ED1 may include a first anode AE1, the first light-emitting pattern EP1, and a first cathode CE1. The second light-emitting element ED2 may include a second anode AE2, the second light-emitting pattern EP2, and a second cathode CE2. The third light-emitting element ED3 may include a third anode AE3, the third light-emitting pattern EP3, and a third cathode CE3. The first to third anodes AE1, AE2, and AE3 may be respectively embodied as a plurality of patterns. In an embodiment, the first light-emitting pattern EP1 may provide red light, the second light-emitting pattern EP2 may provide green light, and the third light-emitting pattern EP3 may provide blue light.

First to third light-emitting openings OP1-E, OP2-E, and OP3-E may be defined in the pixel defining film PDL. The first light-emitting opening OP1-E may expose at least a portion of the first anode AE1. The first light-emitting area PXA-R may be defined as an area of a top face of the first anode AE1 exposed through the first light-emitting opening OP1-E. The second light-emitting opening OP2-E may expose at least a portion of the second anode AE2. The second light-emitting area PXA-G may be defined as an area of a top face of the second anode AE2 exposed through the second light-emitting opening OP2-E. The third light-emitting opening OP3-E may expose at least a portion of the third anode AE3. The third light-emitting area PXA-B may be defined as an area of a top face of the third anode AE3 exposed through the third light-emitting opening OP3-E.

The sacrificial patterns SP1, SP2, and SP3 may include the first sacrificial pattern SP1, the second sacrificial pattern SP2, and the third sacrificial pattern SP3. The first to third sacrificial patterns SP1, SP2, and SP3 may be disposed on the top faces of the first to third anodes AE1, AE2, and AE3, respectively. First to third sacrificial openings OP1-S, OP2-S, and OP3-S respectively corresponding to the first to third light-emitting openings OP1-E, OP2-E, and OP3-E may be respectively defined in the first to third sacrificial patterns SP1, SP2, and SP3.

In the illustrated embodiment, first to third partitioning wall openings OP1-P, OP2-P, and OP3-P respectively corresponding to the first to third light-emitting openings OP1-E, OP2-E, and OP3-E may be defined the partitioning wall PW. Each of the first to third partitioning wall openings OP1-P, OP2-P, and OP3-P may include the first area A1 (refer to FIG. 6) and the second area A2 (refer to FIG. 6) as described above with reference to FIG. 6. The first partitioning wall layer L1 may include the first inner side faces SL1 (refer to FIG. 6) respectively defining portions of the first areas A1 of the first to third partitioning wall openings OP1-P, OP2-P and OP3-P. The second partitioning wall layer L2 may include the second-first inner side faces SL2-1 (refer to FIG. 6) respectively defining the other portions of the first areas A1 of the first to third partitioning wall openings OP1-P, OP2-P and OP3-P, and the second-second inner side faces SL2-2 (refer to FIG. 6) respectively defining portions of the second areas A2 of the first to third partitioning wall openings OP1-P, OP2-P and OP3-P. The third partitioning wall layer L3 may include the third inner side faces SL3 (refer to FIG. 6) respectively defining the other portions of the second areas A2 of the first to third partitioning wall openings OP1-P, OP2-P, and OP3-P.

The first light-emitting pattern EP1 and the first cathode CE1 may be disposed within the first partitioning wall opening OP1-P. The second light-emitting pattern EP2 and the second cathode CE2 may be disposed within the second partitioning wall opening OP2-P. The third light-emitting pattern EP3 and the third cathode CE3 may be disposed within the third partitioning wall opening OP3-P. The first to third cathodes CE1, CE2, and CE3 may respectively contact the first inner side faces SL1 of the first partitioning wall layer L1.

In this embodiment, the first to third cathodes CE1, CE2, and CE3 may be physically separated from each other via the second partitioning wall layer L2 and the third partitioning wall layer L3 constituting a tip, and may be respectively formed in the first to third light-emitting openings OP1-E, OP2-E, and OP3-E, and may contact the first partitioning wall layer L1 and thus be electrically connected to each other and thus may receive a common voltage. The first partitioning wall layer L1 may have relatively higher electrical conductivity than that of each of the second partitioning wall layer L2 and the third partitioning wall layer L3, thereby reducing the contact resistance thereof with each of the first to third cathodes CE1, CE2, and CE3. Accordingly, a common cathode voltage may be provided uniformly to the light-emitting areas PXA-R, PXA-G, and PXA-B.

According to the disclosure, each of a plurality of first light-emitting patterns EP1 may be patterned and deposited on a pixel basis along the tip defined in the partitioning wall PW. That is, the first light-emitting patterns EP1 may be commonly formed using an open mask, but may be easily isolated from each other via the partitioning wall PW on a pixel basis.

On the contrary, when the first light-emitting patterns EP1 are patterned using a fine metal mask ("FMM"), a support spacer protruding from a conductive partitioning wall should be provided to support the fine metal mask. Further, as the fine metal mask is spaced apart from a base face on which the patterning is performed by a height of the partitioning wall and a spacer, there may be a limitation in implementing relatively high resolution. Further, as the fine metal mask contacts the spacer, foreign substances may remain on the spacer after the patterning process of the first light-emitting patterns EP1, or the spacer may be damaged by impression of the fine metal mask. Accordingly, a display panel having a defect may be formed.

In the illustrated embodiment, the partitioning wall PW may easily achieve physical separation between the first to third light-emitting elements ED1, ED2, and ED3. Accordingly, current leakage between adjacent ones of the light-emitting areas PXA-R, PXA-G, and PXA-B and thus, an operation error may be prevented, and an independent operation of each of the first to third light-emitting elements ED1, ED2, and ED3 may be achieved.

In particular, the plurality of first light-emitting patterns EP1 may be patterned without a mask in contact with the internal components in the display area DA (refer to FIG. 1B), such that a defect occurrence may be reduced to provide the display panel DP with improved process reliability. As the patterning is achieved without a separate support spacer protruding from the partitioning wall PW, an area size of each of the light-emitting areas PXA-R, PXA-G, and PXA-B may be miniaturized. Thus, the display panel DP in which the high-resolution is easily implemented may be provided.

Further, in manufacturing a large-area display panel DP, a large-area mask production may be omitted, such that a process cost may be reduced, and a defect that may occur in the large-area mask may be reduced or removed, thereby providing the display panel DP with improved process reliability.

Capping patterns CP1, CP2, and CP3 may include the first capping pattern CP1, the second capping pattern CP2, and the third capping pattern CP3. The first to third capping patterns CP1, CP2, and CP3 may be disposed on the first to third cathodes CE1, CE2, and CE3, respectively, and be disposed within the first to third partitioning wall openings OP1-P, OP2-P, and OP3-P, respectively.

The dummy patterns DMP may include a plurality of first dummy patterns D1, a plurality of second dummy patterns D2, and a plurality of third dummy patterns D3.

The first dummy patterns D1 may include first-first to first-third dummy patterns D11, D12, and D13 which surround the first to third light-emitting areas PXA-R, PXA-G, and PXA-B, respectively, in a plan view. The first-first to first-third dummy patterns D11, D12, and D13 may include the same materials as those of the first to third light-emitting patterns EP1, EP2, and EP3, respectively. The first-first to first-third dummy patterns D11, D12, and D13 and the first to third light-emitting patterns EP1, EP2, and EP3 may be formed in the same processes, respectively.

The second dummy patterns D2 may include second-first to second-third dummy patterns D21, D22, and D23 which surround the first to third light-emitting areas PXA-R, PXA-G, and PXA-B, respectively, in a plan view. The second-first to second-third dummy patterns D21, D22, and D23 may include the same materials as those of the first to third cathodes CE1, CE2, and CE3, respectively. The second-first to second-third dummy patterns D21, D22, and D23 and the first to third cathodes CE1, CE2, and CE3 may be formed in the same processes, respectively.

The third dummy patterns D3 may include third-first to third-third dummy patterns D31, D32, and D33 which surround the first to third light-emitting areas PXA-R, PXA-G, and PXA-B, respectively, in a plan view. The third-first to third-third dummy patterns D31, D32, and D33 may include the same materials as those of the first to third capping patterns CP1, CP2, and CP3, respectively. The third-first to third-third dummy patterns D31, D32, and D33 and the first to third capping patterns CP1, CP2, and CP3 may be formed in the same processes, respectively.

First to third dummy openings OP1-D, OP2-D, and OP3-D corresponding respectively to the first to third light-emitting openings OP1-E, OP2-E, and OP3-E may be defined in the dummy patterns DMP. Each of the first to third dummy openings OP1-D, OP2-D, and OP3-D may include first to third areas AA1, AA2, and AA3 (refer to FIG. 10J) which are sequentially arranged in the third direction DR3. The first dummy opening OP1-D may be defined by inner side faces of the first-first, second-first, and third-first dummy patterns D11, D21, and D31. The second dummy opening OP2-D may be defined by inner side faces of the first-second, second-second, and third-second dummy patterns D12, D22, and D32. The third dummy opening OP3-D may be defined by inner side faces of the first-third, second-third, and third-third dummy patterns D13, D23, and D33.

The thin-film encapsulation layer TFE may include lower encapsulation inorganic patterns LIL1, LIL2, and LIL3, the encapsulation organic film OL, and the upper encapsulation inorganic film UIL. In this embodiment, the lower encapsulation inorganic patterns LIL1, LIL2, and LIL3 may include the first lower encapsulation inorganic pattern LIL1, the second lower encapsulation inorganic pattern LIL2, and the third lower encapsulation inorganic pattern LIL3. The first to third lower encapsulation inorganic patterns LIL1, LIL2, and LIL3 may correspond to the first to third light-emitting openings OP1-E, OP2-E, and OP3-E, respectively.

The first lower encapsulation inorganic pattern LIL1 may cover the first light-emitting element ED1 and the first-first, second-first, and third-first dummy patterns D11, D21, and D31. A portion of the first lower encapsulation inorganic pattern LIL1 may be disposed in the first partitioning wall opening OP1-P. The second lower encapsulation inorganic pattern LIL2 may cover the second light-emitting element ED2 and the first-second, second-second, and third-second dummy patterns D12, D22, and D32. A portion of the second lower encapsulation inorganic pattern LIL2 may be disposed in the second partitioning wall opening OP2-P. The third lower encapsulation inorganic pattern LIL3 may cover the third light-emitting element ED3 and the first-third, second-third, and third-third dummy patterns D13, D23, and D33. A portion of the third lower encapsulation inorganic pattern LIL3 may be disposed in the third partitioning wall opening OP3-P. The first to third lower encapsulation inorganic patterns LIL1, LIL2, and LIL3 may be spaced apart from each other.

Figure 9:
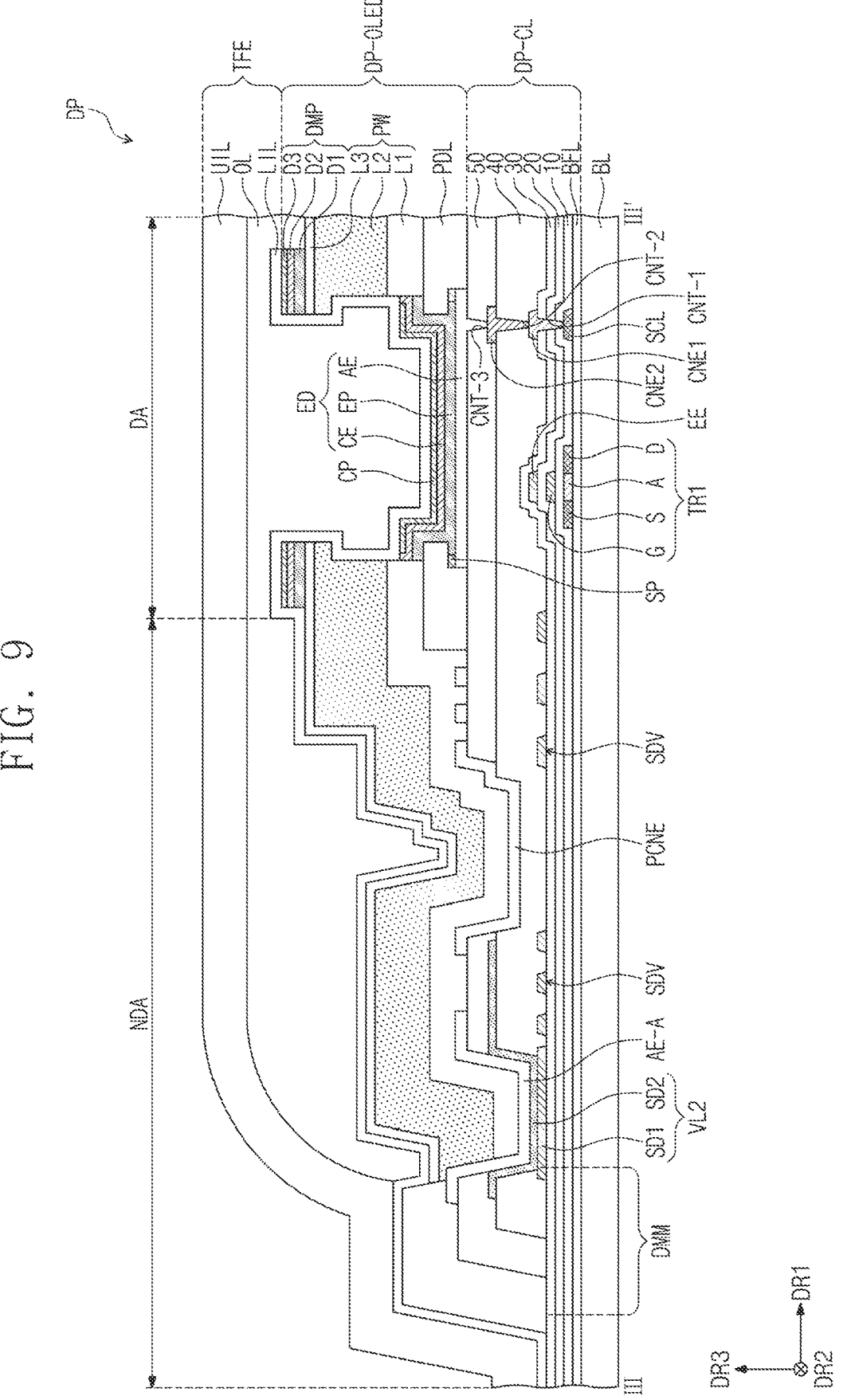
FIG. 9 is a cross-sectional view of a display panel cut along line of FIG. 3.

FIG. 9 is a cross-sectional view of the display panel cut along line III-III' of FIG. 3. FIG. 9 shows an enlarged view of the non-display area NDA and the display area DA adjacent to thereof of the display panel DP. In describing FIG. 9, reference to FIG. 1A to FIG. 7 will be made, and descriptions of the components having the same reference numerals as those in FIG. 1A to FIG. 7 are omitted.

Referring to FIG. 9, the second driving voltage line VL2 may be disposed on a portion of the third insulating layer 30 overlapping the non-display area NDA. The second driving voltage line VL2 may include a plurality of layers. In an embodiment, the second driving voltage line VL2 may include a first electrode layer SD1 and a second electrode layer SD2, for example. The first electrode layer SD1 may be disposed on the third insulating layer 30, and the second electrode layer SD2 may be disposed on the first electrode layer SD1 and the fourth insulating layer 40. The second electrode layer SD2 may be connected to the first electrode layer SD1. As the second electrode layer SD2 extends so as to overlap with the scan driver SDV, a narrow bezel may be realized. Therefore, even when a width of the first electrode layer SD1 is reduced, a total resistance of the second driving voltage line VL2 may be reduced because the second electrode layer SD2 extends so as to overlap the scan driver SDV. However, this is an illustrative embodiment, and the second driving voltage line VL2 may include only one of the first electrode layer SD1 and the second electrode layer SD2.

The partitioning wall PW may extend from a boundary of the display area DA and the non-display area NDA so as to extend away from the display area DA. That is, the partitioning wall PW may extend from the boundary between the display area DA and the non-display area NDA to a portion of the non-display area NDA where the second driving voltage line VL2 is disposed in a direction opposite to the first direction DR1. The partitioning wall PW extending to the non-display area NDA may be disposed on the pixel defining film PDL, the fifth insulating layer 50, an auxiliary connection electrode PCNE, and an auxiliary electrode AE-A.

The auxiliary electrode AE-A may be disposed on the second driving voltage line VL2. In detail, the auxiliary electrode AE-A may cover an end of the fifth insulating layer 50 and may be disposed on the second electrode layer SD2.

As the auxiliary electrode AE-A is disposed so as to contact a top face of the second electrode layer SD2, the auxiliary electrode AE-A may be electrically connected to the second driving voltage line VL2. That is, the cathode CE contacting the partitioning wall PW may be electrically connected to the second driving voltage line VL2 via the auxiliary electrode AE-A. Therefore, as the driving voltage is transferred to the cathode CE via the partitioning wall PW having a relatively large thickness, a voltage drop of the driving voltage may be reduced. The auxiliary electrode AE-A and the anode AE may be formed in the same process.

According to the disclosure, as the first partitioning wall layer L1 includes indium zinc oxide, the first partitioning wall layer L1 may have a relatively high reduction potential. A difference between a potential level of the first partitioning wall layer L1 and a potential level of the auxiliary electrode AE-A in direct contact with the first partitioning wall layer L1 may be reduced. Accordingly, occurrence of a corrosion reaction (e.g., galvanic corrosion) at a portion of the first partitioning wall layer L1 in contact with the auxiliary electrode AE-A may be reduced. Therefore, damage to the first partitioning wall layer L1 due to the corrosion reaction may be prevented, thereby reducing or eliminating occurrence of defects in the partitioning wall PW. Further, electrical reliability between the partitioning wall PW and the auxiliary electrode AE-A may be improved, so that the driving voltage may be stably provided to the cathode CE.

The auxiliary connection electrode PCNE may be disposed on the fourth insulating layer 40 and the fifth insulating layer 50. The auxiliary connection electrode PCNE and the anode AE may be formed in the same process. As the first partitioning wall layer L1 includes indium zinc oxide, a difference between the potential level of the first partitioning wall layer L1 and a potential level of the auxiliary connection electrode PCNE in direct contact with the first partitioning wall layer L1 may be reduced. Accordingly, occurrence of a corrosion reaction (e.g., galvanic corrosion) at a portion of the first partitioning wall layer L1 in contact with the auxiliary connection electrode PCNE may be reduced. Therefore, damage to the first partitioning wall layer L1 due to the corrosion reaction may be prevented, thereby reducing or eliminating occurrence of defects in the partitioning wall PW.

The scan driver SDV may include a plurality of thin-film transistors formed in the same process as a process in which the pixel circuit PDC (refer to FIG. 4) of the pixel PX (refer to FIG. 3) is formed.

A dam DMM may be disposed in the non-display area NDA. The dam DMM may consist of a plurality of insulating layers. In an embodiment, the dam DMM may include a first layer formed in the same process as a process in which the fourth insulating layer 40 is formed, a second layer formed in the same process as a process in which the fifth insulating layer 50 is formed, and a third layer formed in the same process as a process in which the pixel defining film PDL is formed. However, the disclosure is not limited thereto, and unlike the embodiment shown in FIG. 9, the dam DMM may include four or more layers. The encapsulation organic film OL may extend to area where the dam DMM is formed. That is, the dam DMM may serve to control flow of a monomer when the encapsulation organic film OL is formed.

FIG. 10A to FIG. 10M are cross-sectional views showing an embodiment of some of operations of a display panel manufacturing method according to the disclosure. In describing FIG. 10A to FIG. 10M, reference to FIG. 1 to FIG. 8 will be made, and the same/similar reference numerals as those in FIG. 1 to FIG. 8 are allocated to the same/similar components as those in FIG. 1 to FIG. 8, and redundant descriptions are omitted.

The display panel manufacturing method according to the disclosure may include providing a pre-display panel including a base layer, an anode disposed on the base layer, and a pixel defining film which is disposed on the base layer and in which a light-emitting opening exposing a portion of the anode may be defined, forming a first pre-partitioning wall layer including an indium zinc oxide on the pre-display panel, forming a second pre-partitioning wall layer including molybdenum-tantalum alloy oxide on the first pre-partitioning wall layer, forming a third pre-partitioning wall layer including an aluminum oxide on the second pre-partitioning wall layer, etching the first to third pre-partitioning wall layers to form a partitioning wall having a partitioning wall opening defined therein, and forming a light-emitting pattern and a cathode in the partitioning wall opening such that the cathode may contact the partitioning wall.

Hereinafter, with reference to FIG. 10A to FIG. 10M, a method for forming one light-emitting element ED, the lower encapsulation inorganic pattern LIL covering the light-emitting element ED, the encapsulation organic film OL, and the upper encapsulation inorganic film UIL will be described.

Figure 10A:
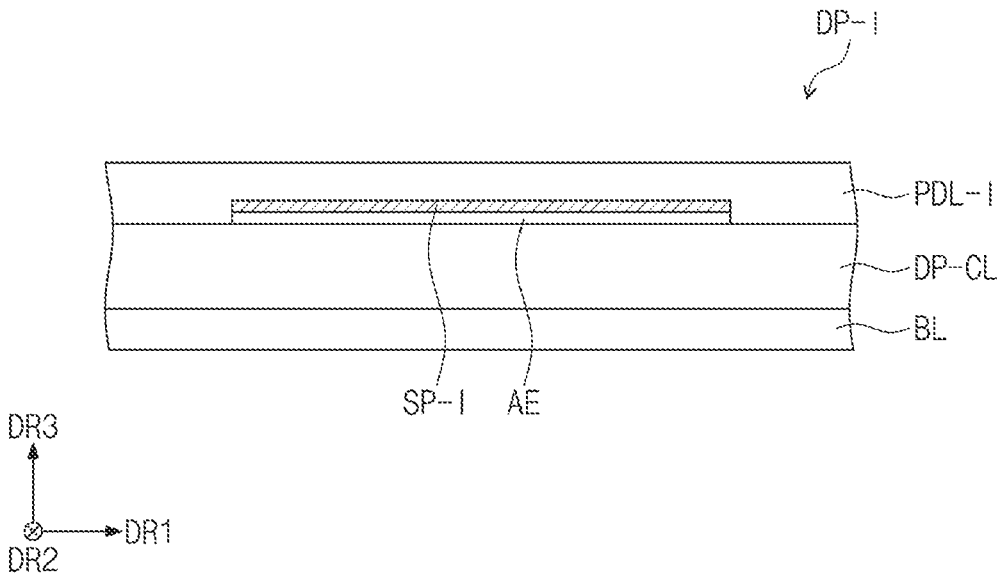
FIG. 10A to FIG. 10M are cross-sectional views showing an embodiment of some of operations of a display panel manufacturing method according to the disclosure.

Referring to FIG. 10A, the display panel manufacturing method according to this embodiment may include an operation of providing a pre-display panel DP-I. The pre-display panel DP-I provided in this embodiment may include the base layer BL, the circuit element layer DP-CL, the anode AE, a pre-sacrificial pattern SP-I, and a pre-pixel defining film PDL-I.

The circuit element layer DP-CL may be formed using a conventional manufacturing process of a circuit element in which an insulating layer, a semiconductor layer, and a conductive layer are formed using a scheme such as coating or deposition, and the insulating layer, the semiconductor layer, and the conductive layer are selectively patterned using a photolithography and etching process to form a semiconductor pattern, a conductive pattern, and a signal line.

The anode AE and the pre-sacrificial pattern SP-I may be formed in the same patterning process. The pre-pixel defining film PDL-I may cover both the anode AE and the pre-sacrificial pattern SP-I.

Figure 10B:
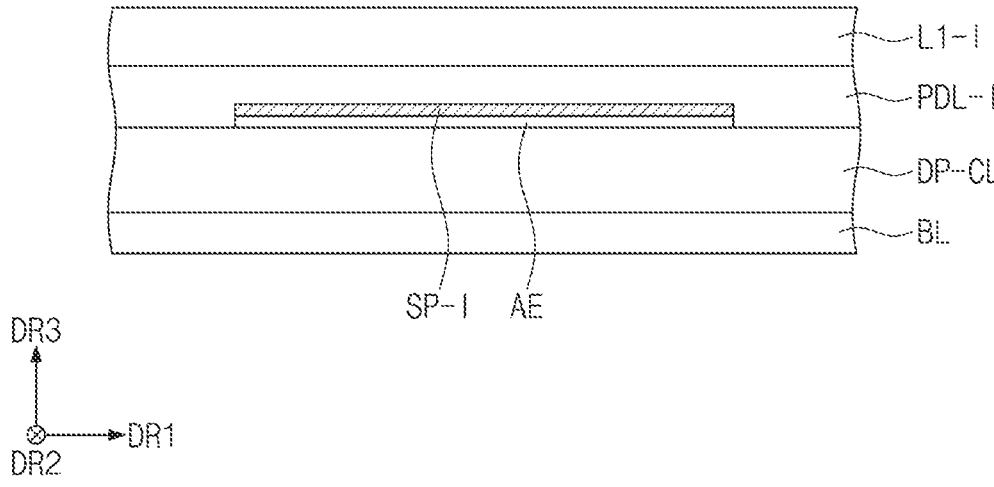

Then, referring to FIG. 10B, the display panel manufacturing method according to this embodiment may include forming a first pre-partitioning wall layer L1-I on the pre-pixel defining film PDL-I. The operation of forming the first pre-partitioning wall layer L1-I may include a deposition process of a conductive material. In this embodiment, the conductive material constituting the first pre-partitioning wall layer L1-I may include the indium zinc oxide.

Figure 10C:
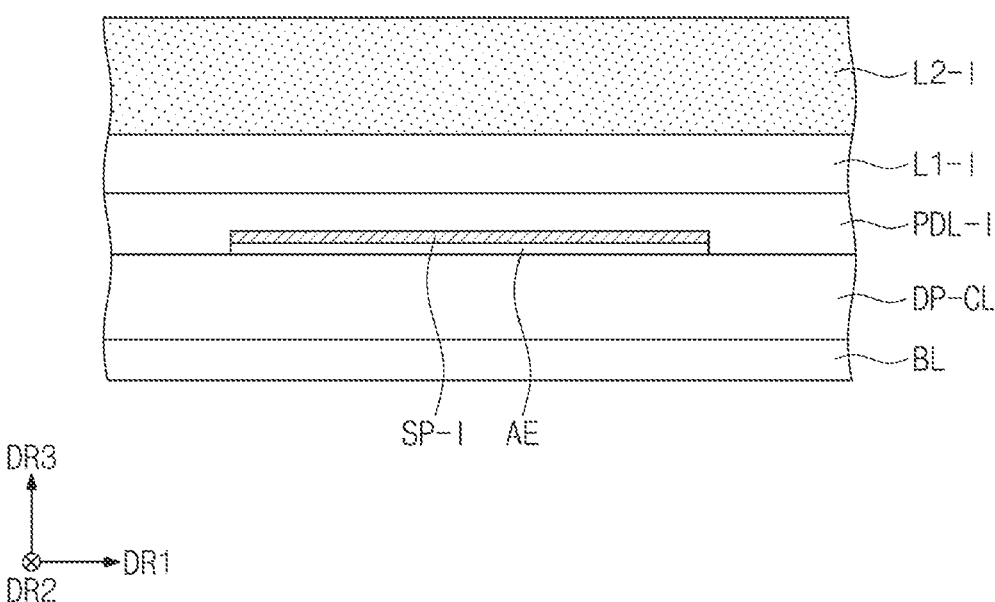

Then, referring to FIG. 10C, the display panel manufacturing method according to this embodiment may include forming a second pre-partitioning wall layer L2-I on the first pre-partitioning wall layer L1-I. The operation of forming the second pre-partitioning wall layer L2-I may include a deposition process of a conductive material. In this embodiment, the conductive material constituting the second pre-partitioning wall layer L2-I may include the molybdenum tantalum alloy oxide.

Figure 10D:
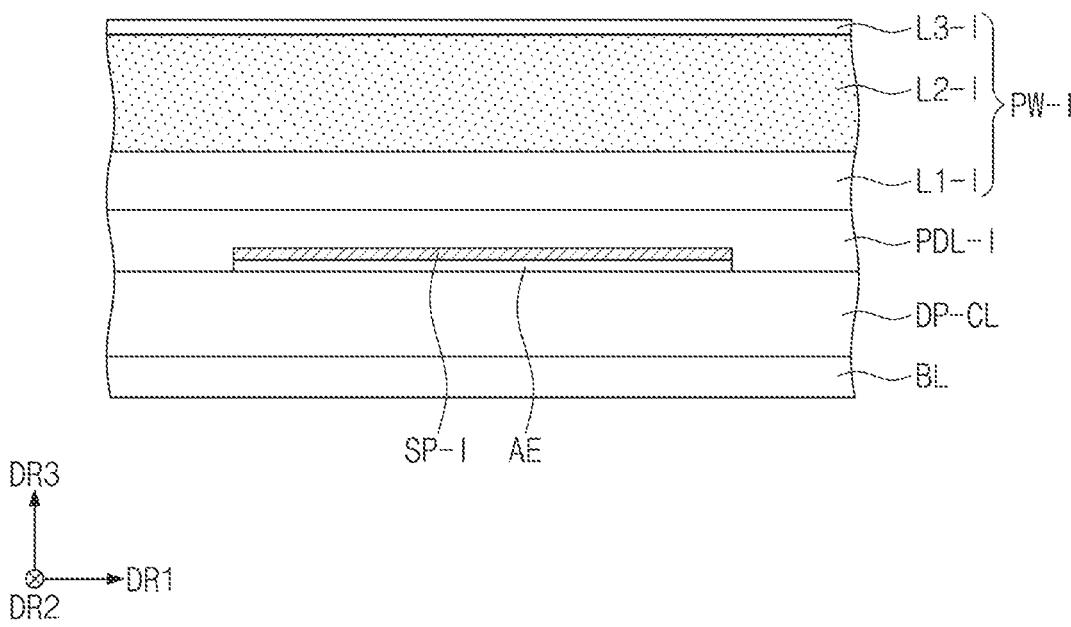

Then, referring to FIG. 10D, the display panel manufacturing method according to this embodiment may include forming a third pre-partitioning wall layer on the second pre-partitioning wall layer L2-I so that a pre-partitioning wall PW-I is formed. The operation of forming the third pre-partitioning wall layer L3-I may include a conductive material deposition process. In an embodiment, the operation of forming the third pre-partitioning wall layer L3-I may be performed by a sputtering deposition process, for example. In this embodiment, the conductive material constituting the third pre-partitioning wall layer L3-I may include the aluminum oxide ($AlO_x$). The pre-partitioning wall PW-I may include the first pre-partitioning wall layer L1-I, the second pre-partitioning wall layer L2-I, and the third pre-partitioning wall layer L3-I.

Figure 10E:
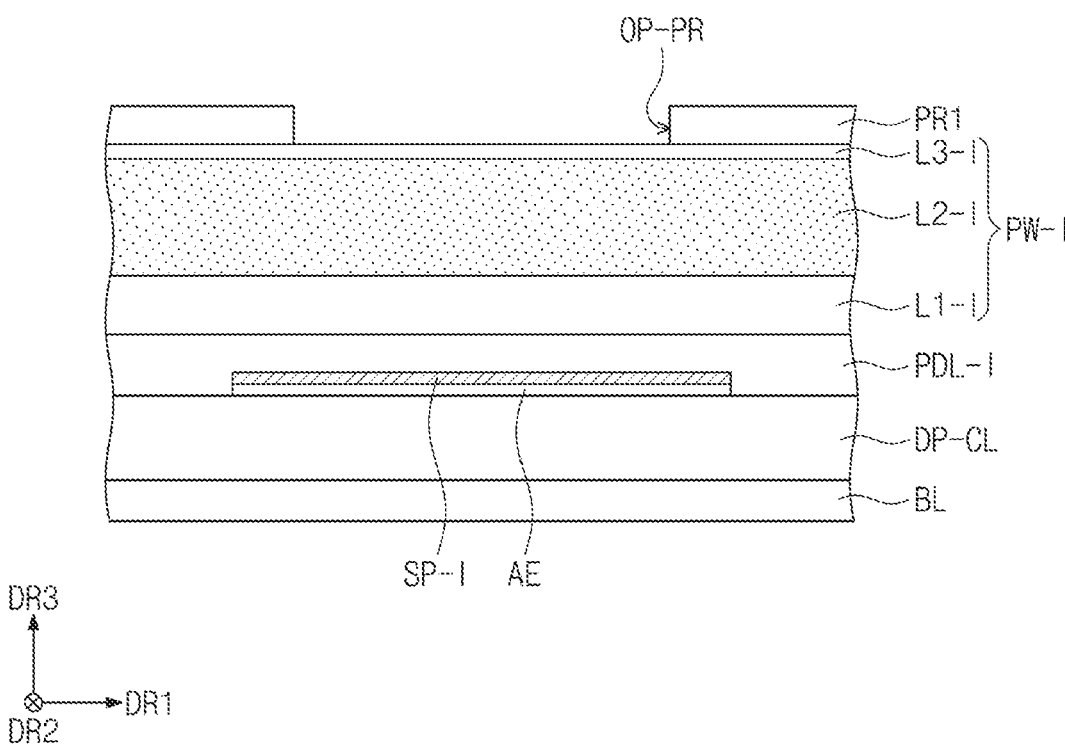

Then, referring to FIG. 10E, the display panel manufacturing method according to this embodiment may include forming a first photoresist layer PR1 on the pre-partitioning wall PW-I. The first photoresist layer PR1 may be formed by forming a pre-photoresist layer on the pre-partitioning wall PW-I and then patterning the pre-photoresist layer using a photo mask. Through the patterning process, a photo-opening OP-PR overlapping the anode AE may be defined in the first photoresist layer PR1. Then, referring to FIG. 10F and FIG. 10G, the display panel manufacturing method according to this embodiment may include etching the first pre-partitioning wall layer L1-I, the second pre-partitioning wall layer L2-I, and the third pre-partitioning wall layer L3-I to form the partitioning wall PW from the pre-partitioning wall PW-I.

Figure 10F:
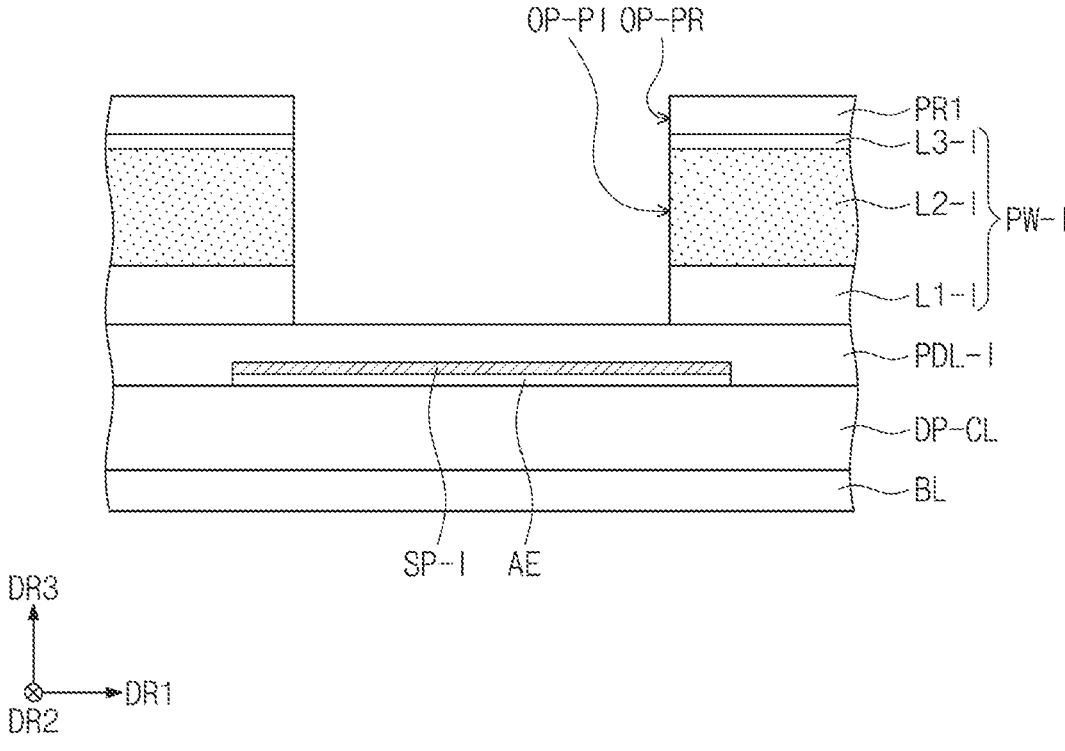

First, as shown in FIG. 10F, first etching of the first pre-partitioning wall layer L1-I, the second pre-partitioning wall layer L2-I, and the third pre-partitioning wall layer L3-I may include perform dry etching of the first pre-partitioning wall layer L1-I, the second pre-partitioning wall layer L2-I, and the third pre-partitioning wall layer L3-I using the first photoresist layer PR1 as a mask to define a pre-partitioning wall opening OP-PI in the pre-partitioning wall PW-I.

The first etching process in this embodiment may be performed in an etching environment in which etch selectivity of the first pre-partitioning wall layer L1-I, the second pre-partitioning wall layer L2-I, and the third pre-partitioning wall layer L3-I are substantially the same as each other. Accordingly, an inner side face of the first pre-partitioning wall layer L1-I, an inner side face of the second pre-partitioning wall layer L2-I, and an inner side face of the third pre-partitioning wall layer L3-I defining the pre-partitioning wall opening OP-PI may be substantially aligned with each other.

Figure 10G:
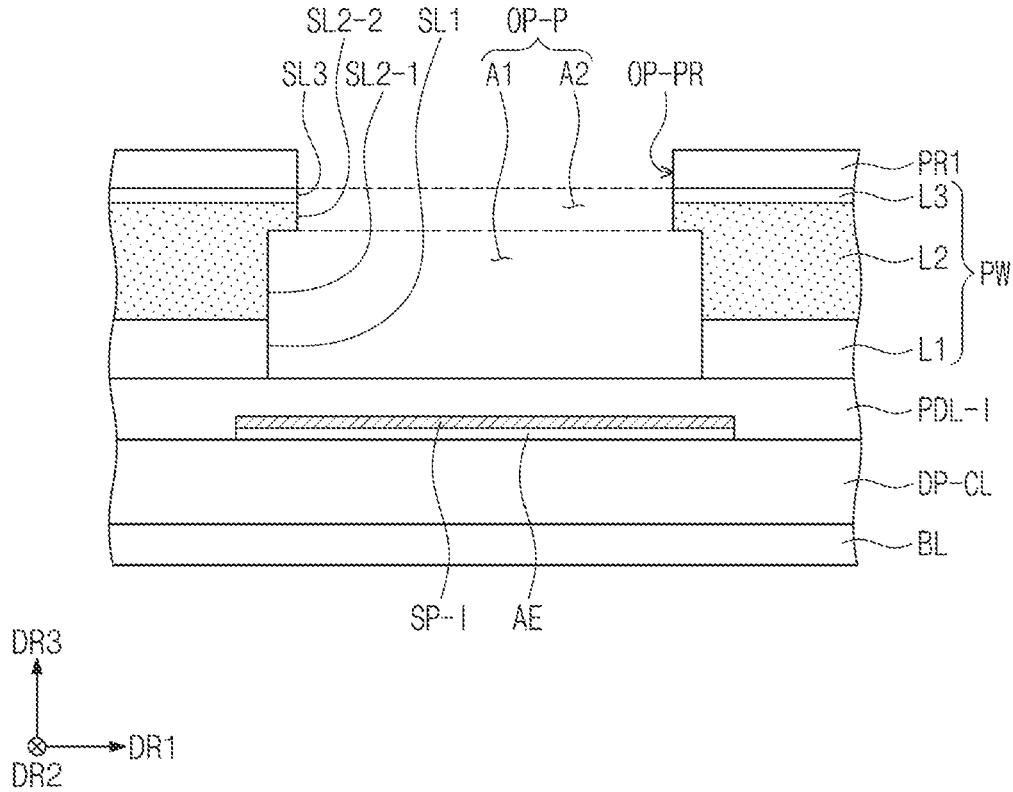

Then, as shown in FIG. 10G, second etching of the first pre-partitioning wall layer L1-I and the second pre-partitioning wall layer L2-I may include performing wet etching of the first pre-partitioning wall layer L1-I and the second pre-partitioning wall layer L2-I using the first photoresist layer PR1 as a mask to define the partitioning wall opening OP-P from the pre-partitioning wall opening OP-PI (refer to FIG. 10F).

The partitioning wall opening OP-P may include the first area A1 and the second area A2 sequentially arranged in a thickness direction, that is, the third direction DR3. The first partitioning wall layer L1 may include the first inner side face SL1 defining the portion of the first area A1 of the partitioning wall opening OP-P. The second partitioning wall layer L2 may include the second-first inner side face SL2-1 defining the other portion of the first area A1 and the second-second inner side face SL2-2 defining a portion of the second area A2. The third partitioning wall layer L3 may include the third inner side face SL3 defining the other portion of the second area A2.

The second etching process in this embodiment may be performed in an environment where a difference between the etch selectivity of the first pre-partitioning wall layer L1-I and that of each of the second and third pre-partitioning wall layers L2-I and L3-I is large. Accordingly, the partitioning wall PW defining the partitioning wall opening OP-P may have the undercut shape in a cross-sectional view. Specifically, as an etch rate of the first partitioning wall layer L1 using an etching solution is greater than an etch rate of each of the second and third partitioning wall layers L2 and L3 using the etching solution, a considerable amount of the first partitioning wall layer L1 is etched. Accordingly, the first inner side face SL1 of the first partitioning wall layer L1 may be depressed inwardly than each of the second-second inner side face SL2-2 of the second partitioning wall layer L2 and the third inner side face SL3 of the third partitioning wall layer L3 may be. The tip of the partitioning wall PW may consist of portions of the second partitioning wall layer L2 and the third partitioning wall layer L3 protruding inwardly beyond the first partitioning wall layer L1.

In FIG. 10G, it is shown that a portion of each of the first partitioning wall layer L1 and the second partitioning wall layer L2 is etched such that the other portion of the second partitioning wall layer L2 and the third partitioning wall layer L3 constitute the tip of the partitioning wall PW in an illustrative embodiment. However, the disclosure is not limited thereto. In an embodiment, only the first partitioning wall layer L1 may be wet etched so that the second partitioning wall layer L2 and the third partitioning wall layer L3 constitute the tip, for example. In an alternative embodiment, the first partitioning wall layer L1 and the second partitioning wall layer L2 may be wet etched so that only the third partitioning wall layer L3 may constitute the tip.

Figure 10H:
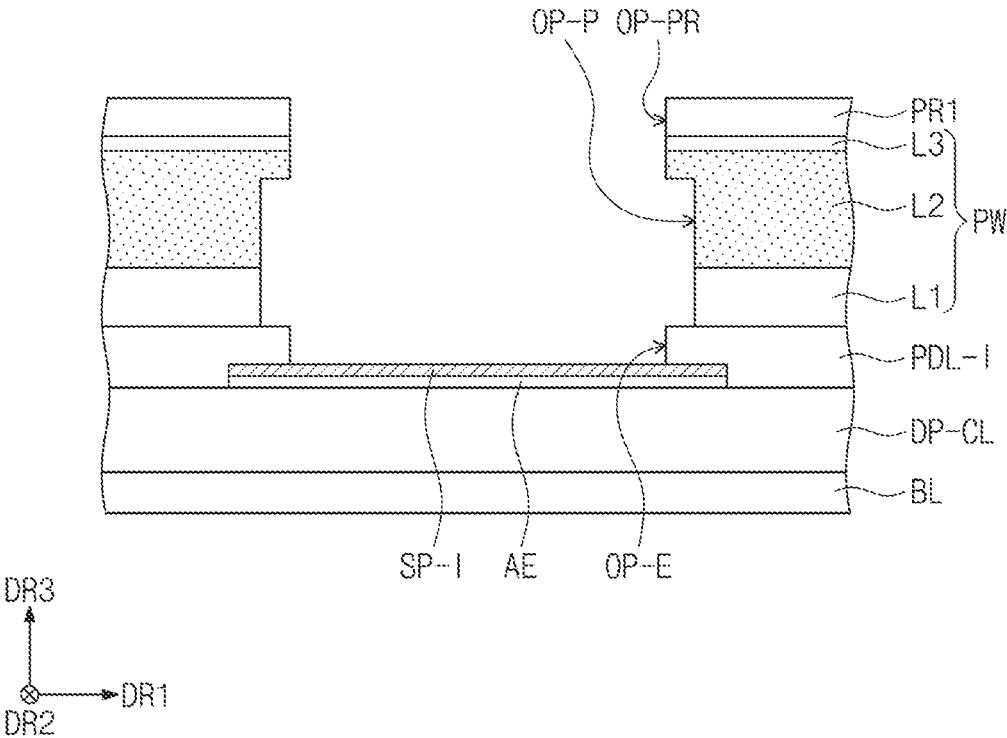

Then, referring to FIG. 10H, the display panel manufacturing method according to this embodiment may include etching the pre-pixel defining film PDL-I to form the pixel defining film PDL (refer to FIG. 10D. The etching process of the pre-pixel defining film PDL-I may be carried out in a dry etching scheme. The first photoresist layer PR1 and the partitioning wall PW (e.g., the second partitioning wall layer L2 and the third partitioning wall layer L3) may be used as a mask against etching. The light-emitting opening OP-E corresponding to the partitioning wall opening OP-P may be defined in the pixel defining film PDL.

Figure 10I:
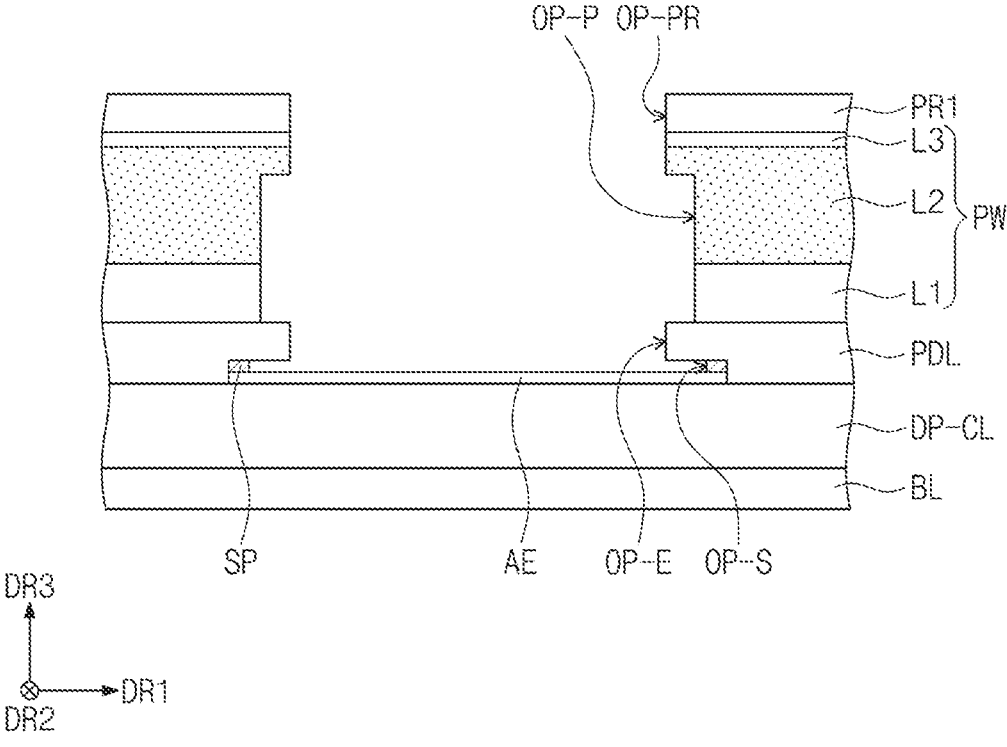

Then, referring to FIG. 10I, the display panel manufacturing method according to this embodiment may include etching the pre-sacrificial pattern SP-I. The etching process of the pre-sacrificial pattern SP-I may include a wet etching scheme in which the first photoresist layer PR1 and the partitioning wall PW (e.g., the second partitioning wall layer L2 and the third partitioning wall layer L3) are used as a mask.

The sacrificial opening OP-S overlapping the light-emitting opening OP-E may be defined in the sacrificial pattern SP formed by etching the pre-sacrificial pattern SP-I. At least a portion of the anode AE may be exposed though the sacrificial opening OP-S and the light-emitting opening OP-E defined respectively in the sacrificial pattern SP and the pixel defining film PDL. The sacrificial pattern SP may include the azo compound. The sacrificial pattern SP may include or consist of aluminum (Al) doped zinc oxide ($ZnO_x$) In this regard, a content of aluminum (Al) may be in a range of about 2 at % to about 5 at %.

The etching process of the sacrificial pattern SP may be performed in an environment where a difference between the etching selectivity of the sacrificial pattern SP and that of the anode AE is large. This may prevent the anode AE from being etched. That is, the sacrificial pattern SP having a higher etch rate than that of the anode AE may be disposed between the pixel defining film PDL and the anode AE, thereby preventing the anode AE from being etched and damaged during the etching process.

Further, the etching process of the sacrificial pattern SP may be performed in an environment where a difference between the etching selectivity of the first and second partitioning wall layers L1 and L2 of the partitioning wall PW and that of the sacrificial pattern SP is large. This may prevent the first and second partitioning wall layers L1 and L2 from being etched. In an embodiment, the etch rate of the sacrificial pattern SP including the azo compound may be about 370 angstroms/sec, and the etch rate of the first partitioning wall layer L1 may be about 19 angstroms/sec, for example. The etch rate of the sacrificial pattern SP may be higher by about 18 times to about 30 times than the etch rate of the first partitioning wall layer L1. Thus, etch loss of the partitioning wall PW may be reduced.

Figure 10J:
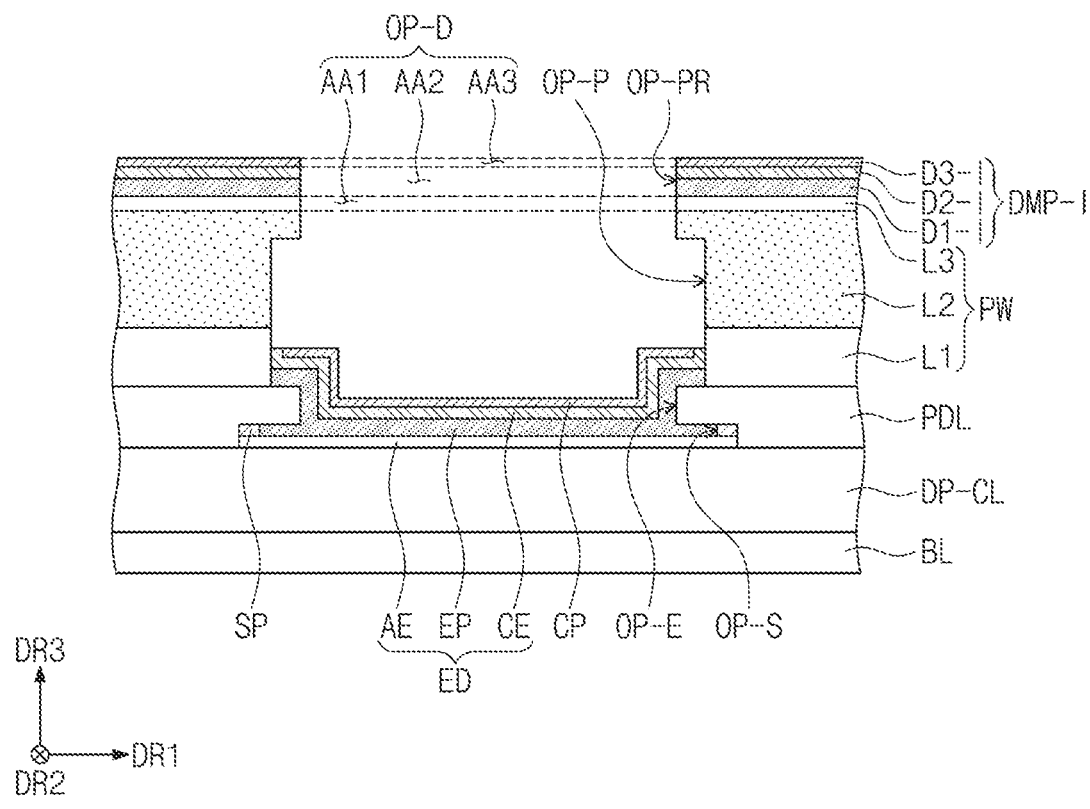

Then, referring to FIG. 10J, the display panel manufacturing method according to this embodiment may include removing the first photoresist layer PR1 (refer to FIG. 10I), and then forming the light-emitting pattern EP, and then forming the cathode CE, and then, forming the capping pattern CP.

Each of the operations of forming the light-emitting pattern EP, forming the cathode CE, and forming the capping pattern CP may be performed in a deposition process. In an embodiment, the operation of forming the light-emitting pattern EP may be performed in a thermal evaporation process, and the operation of forming the cathode CE may be performed in a sputtering process, and the operation of forming the capping pattern CP may be performed in a thermal evaporation process. However, the disclosure is not limited thereto.

In the operation of forming the light-emitting pattern EP, each light-emitting pattern EP may be disposed within each light-emitting opening OP-E and each partitioning wall opening OP-P such that the light-emitting patterns EP may be isolated from each other via the tip of the partitioning wall PW. In the operation of forming the light-emitting pattern EP, a first pre-dummy pattern D1-I spaced apart from the light-emitting pattern EP may be formed on the partitioning wall PW.

In the operation of forming the cathode CE, each cathode CE may be disposed within each partitioning wall opening OP-P such that the cathodes CE may be isolated from each other via the tip of the partitioning wall PW. The cathode CE may be formed via sputtering at a larger incident angle than that in forming the light-emitting pattern EP, so that the cathode CE may be formed to contact the first inner side face SL1 of the first partitioning wall layer L1. In the operation of forming the cathode CE, a second pre-dummy pattern D2-I spaced apart from the cathode CE may be formed on the partitioning wall PW. The anode AE, the light-emitting pattern EP, and the cathode CE may constitute the light-emitting element ED.

In the operation of forming the capping pattern CP, each capping pattern CP may be disposed in each partitioning wall opening OP-P such that the capping patterns CP may be isolated from each other via the tip of the partitioning wall PW. In the operation of forming the capping pattern CP, a third pre-dummy pattern D3-I spaced apart from the capping pattern CP may be formed on the partitioning wall PW. In an embodiment, in another embodiment of the disclosure, the operation of forming the capping pattern CP may be omitted.

The first to third pre-dummy patterns D1-I, D2-I, and D3-I may constitute pre-dummy patterns DMP-I, and the dummy opening OP-D may be defined in the pre-dummy patterns DMP-I. The dummy opening OP-D may include the first area AA1, the second area AA2, and the third area AA3 sequentially arranged in a thickness direction, that is, the third direction DR3. The first area AA1 of the dummy opening OP-D may be defined by an inner side face of the first dummy pattern D1 (refer to FIG. 10L). The second area AA2 may be defined by the inner side face of the second dummy pattern D2 (refer to FIG. 10L), and the third area AA3 may be defined by the inner side face of the third dummy pattern D3 (refer to FIG. 10L).

Figure 10K:
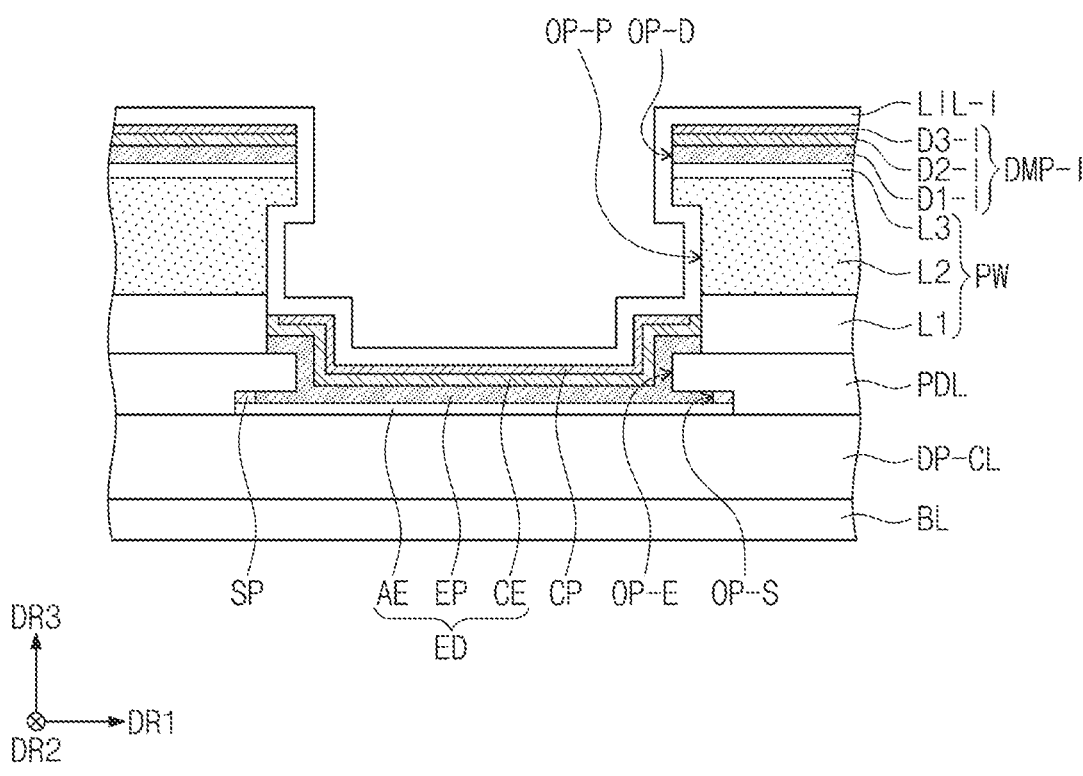

Then, referring to FIG. 10K, the display panel manufacturing method according to this embodiment may include forming a pre-lower encapsulation inorganic pattern LIL-I. The pre-lower encapsulation inorganic pattern LIL-I may be formed through a deposition process. In an embodiment, the pre-lower encapsulation inorganic pattern LIL-I may be formed using a chemical vapor deposition ("CVD") process. The pre-lower encapsulation inorganic pattern LIL-I may be formed on the partitioning wall PW and the cathode CE, and a portion of the pre-lower encapsulation inorganic pattern LIL-I may be formed inside the partitioning wall opening OP-P.

Figure 10L:
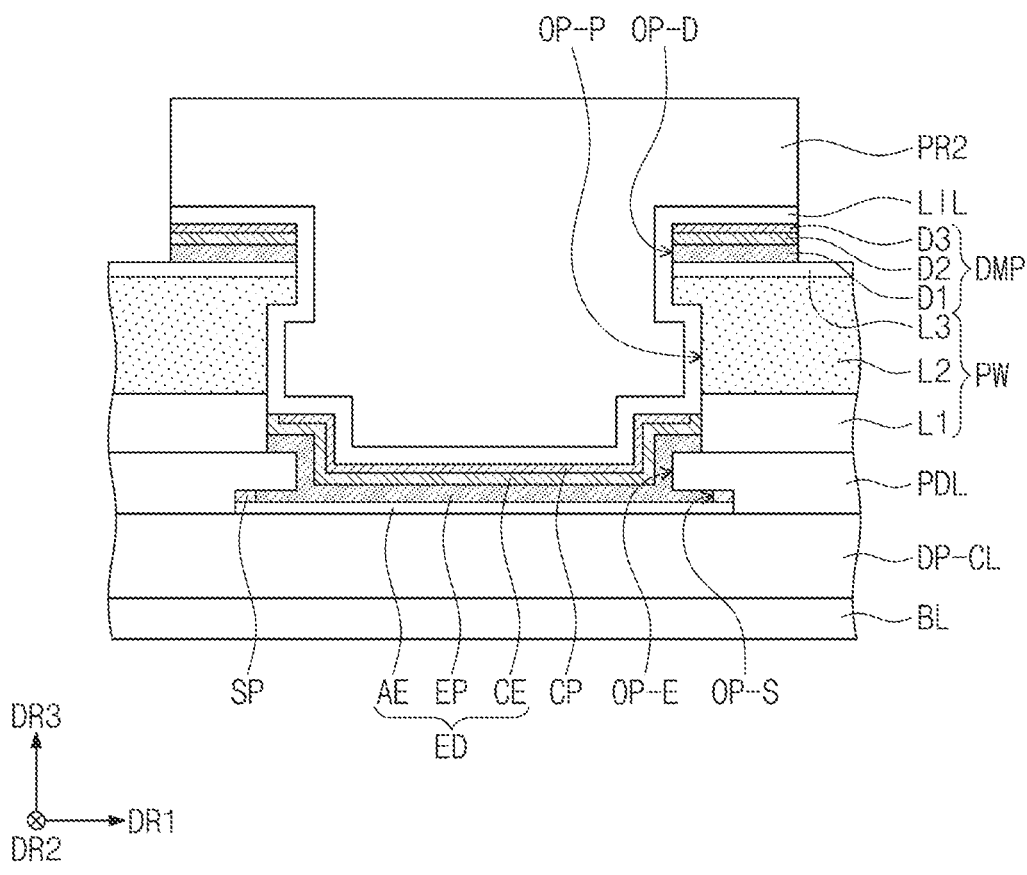

Then, referring to FIG. 10L, the display panel manufacturing method according to this embodiment includes forming a second photoresist layer PR2, patterning the pre-lower encapsulation inorganic pattern LIL-I (refer to FIG. 10K) to form the lower encapsulation inorganic pattern LIL, and patterning the pre-dummy patterns DMP-I (refer to FIG. 10K) to form the dummy patterns DMP.

In the operation of forming the second photoresist layer PR2, the second photoresist layer PR2 may be formed by forming a pre-photoresist layer and then patterning the pre-photoresist layer using a photo mask. Through the patterning process, the second photoresist layer PR2 may be patterned into a pattern corresponding to the light-emitting opening OP-E.

The operation of patterning the pre-lower encapsulation inorganic pattern LIL-I may include performing dry etching of the pre-lower encapsulation inorganic pattern LIL-I, such that a portion of the pre-lower encapsulation inorganic pattern LIL-I overlapping with anodes other than a corresponding anode AE thereto is removed. In an embodiment, when the pre-lower encapsulation inorganic pattern LIL-I corresponds to the first anode AE1 (refer to FIG. 8), a portion of the pre-lower encapsulation inorganic pattern LIL-I overlapping the second and third anodes AE2 and AE3 (refer to FIG. 8) may be removed, for example.

Thus, the lower encapsulation inorganic pattern LIL overlapping with a corresponding light-emitting opening OP-E may be formed from the patterned pre-lower encapsulation inorganic pattern LIL-I. A portion of the lower encapsulation inorganic pattern LIL may be disposed within the partitioning wall opening OP-P so as to cover the light-emitting element ED, while the other portion of the lower encapsulation inorganic pattern LIL may be disposed on the partitioning wall PW.

In the operation of patterning the pre-dummy patterns DMP-I, the first to third pre-dummy patterns D1-I, D2-I, and D3-I may be dry etched such that a portion of each of the first to third pre-dummy patterns D1-I, D2-I, and D3-I overlapping with anodes other than a corresponding anode AE thereto may be removed. In an embodiment, when the first to third pre-dummy patterns D1-I, D2-I, and D3-I correspond to the first anode AE1 (refer to FIG. 8), a portion of each of the first to third pre-dummy patterns D1-I, D2-I, and D3-I overlapping with the second and third anodes AE2 and AE3 (refer to FIG. 8) may be removed, for example.

The patterned first to third pre-dummy patterns D1-I, D2-I, and D3-I may be respectively converted to the first to third dummy patterns D1, D2 and D3 overlapping with a corresponding light-emitting opening OP-E. Thus, the dummy patterns DMP including the first to third dummy patterns D1, D2, and D3 may be formed. Each of the first to third dummy patterns D1, D2, and D3 may have a closed-line shape that surrounds a corresponding light-emitting area PXA (refer to FIG. 5) in a plan view.

Figure 10M:
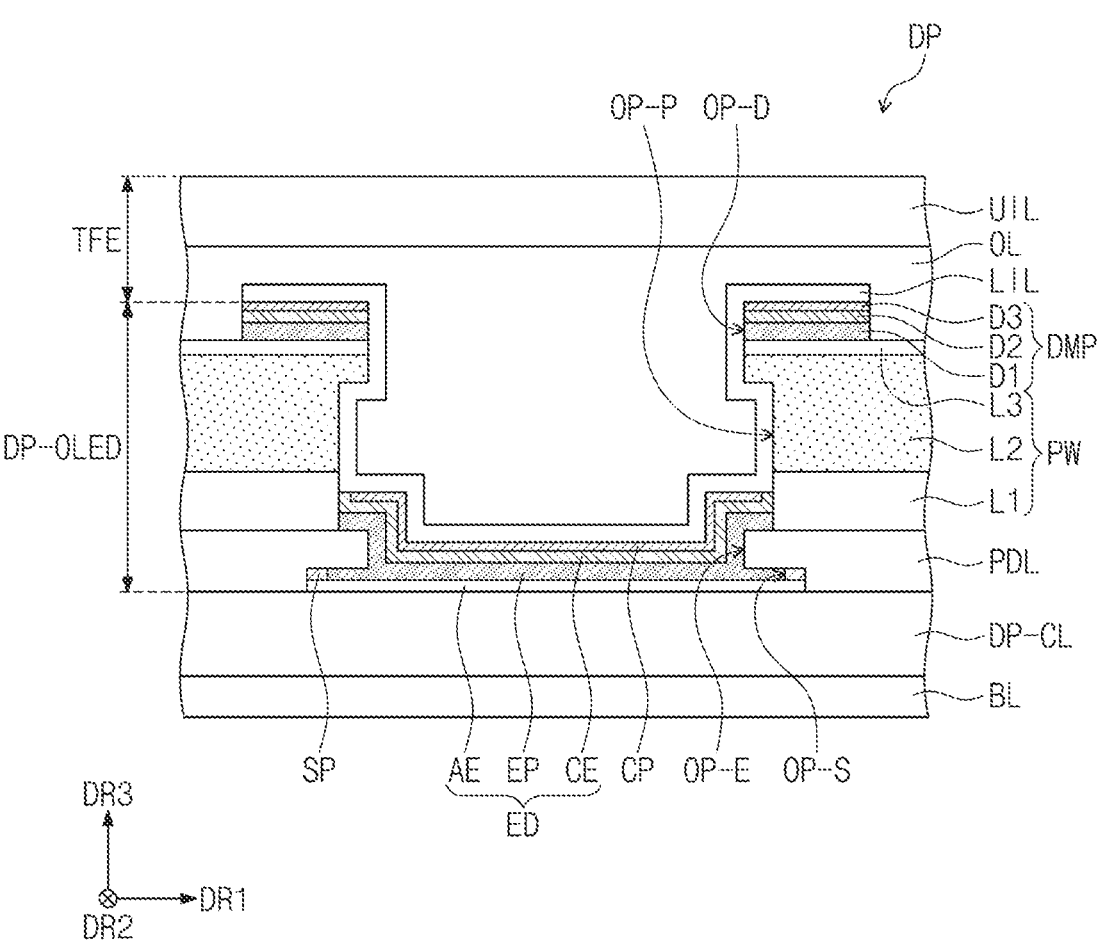

Afterwards, referring to FIG. 10M, the display panel manufacturing method according to this embodiment may include removing the second photoresist layer PR2 (refer to FIG. 10L), and forming the encapsulation organic film OL and the upper encapsulation inorganic film UIL to manufacture the display panel DP. The encapsulation organic film OL may be formed by applying an organic material in an inkjet scheme. However, the disclosure is not limited thereto. The encapsulation organic film OL provides a planarized top face. Thereafter, the upper encapsulation inorganic film UIL may be formed by depositing an inorganic material on the encapsulation organic film OL. In this way, the display panel DP including the base layer BL, the circuit element layer DP-CL, the display element layer DP-OLED, and the thin-film encapsulation layer TFE may be formed.

Between the operation of forming the lower encapsulation inorganic pattern LIL and the operation of forming the upper encapsulation inorganic film UIL to manufacture the display panel DP, following operations may be further performed: an operation of forming a partitioning wall opening and a light-emitting opening corresponding to a light-emitting area of each of other colors in the partitioning wall PW and the pixel defining film PDL, respectively, an operation of forming a light-emitting element providing light of each of the other colors, and an operation of forming a lower encapsulation inorganic pattern covering the light-emitting element providing light of each of the other colors. Thus, as shown in FIG. 8, the display panel DP including the first to third light-emitting elements ED1, ED2, and ED3, the first to third capping patterns CP1, CP2, and CP3, the first-first to first-third dummy patterns D1-1, D1-2, and D1-3, the second-first to second-third dummy patterns D2-1, D2-2, and D2-3, the third-first to third-third dummy patterns D3-1, D3-2, and D3-3, and the first to third lower encapsulation inorganic patterns LIL1, LIL2, and LIL3 may be formed.

As described above, the display panel may include the sacrificial pattern disposed between the anode and the pixel defining film, and the partitioning wall may include the plurality of partitioning wall layers. The sacrificial pattern includes the azo compound, thereby preventing the first and second partitioning wall layers from being etched together therewith. Further, the first partitioning wall layer includes the indium zinc oxide. Thus, the cathode may contact the inner side face of the first partitioning wall layer so as to receive the second driving voltage. The phenomenon that the oxide film is formed on the first partitioning wall layer to increase electrical resistance in a contact area between the first partitioning wall layer and the cathode may be reduced or eliminated. The second partitioning wall layer includes the molybdenum tantalum alloy oxide, such that color mixing between light beams respectively emitted from the first to third light-emitting patterns may be prevented. The third partitioning wall layer includes the aluminum oxide having a relatively large Young's modulus such that the deformation of the third partitioning wall layer may be reduced.

While the disclosure has been described with reference to embodiments thereof, it will be apparent to those of ordinary skill in the art that various changes and modifications may be made thereto without departing from the spirit and scope of the disclosure as set forth in the following claims.

What is claimed is:

1. A display panel comprising:
a base layer;
a pixel defining film disposed on the base layer, wherein a light-emitting opening is defined in the pixel defining film;
a partitioning wall which is disposed on the pixel defining film and in which a partitioning wall opening corresponding to the light-emitting opening is defined, the partitioning wall including:
a first partitioning wall layer disposed on the pixel defining film and defining a first portion of a first area of the partitioning wall opening;
a second partitioning wall layer disposed on the first partitioning wall layer and defining a second portion of the first area and a first portion of a second area of the partitioning wall opening; and
a third partitioning wall layer disposed on the second partitioning wall layer and defining a second portion of the second area of the partitioning wall opening;
a sacrificial pattern disposed between the anode and the pixel defining film, wherein a sacrificial opening overlapping the light-emitting opening is defined in the sacrificial pattern; and
a light-emitting element disposed in the partitioning wall opening, the light-emitting element including:
an anode;
a middle layer; and
a cathode contacting the partitioning wall.

2. The display panel of claim 1, wherein the first partitioning wall layer includes an indium zinc oxide.

3. The display panel of claim 1, wherein the second partitioning wall layer includes a molybdenum tantalum alloy oxide.

4. The display panel of claim 1, wherein the third partitioning wall layer includes an aluminum oxide.

5. The display panel of claim 1, wherein the third partitioning wall layer includes a material having a Young's modulus of about 300 gigapascals or greater.

6. The display panel of claim 1, wherein a thickness of the first partitioning wall layer is in a range of about 1000 angstroms to about 2500 angstroms.

7. The display panel of claim 1, wherein a thickness of the second partitioning wall layer is in a range of about 4000 angstroms to about 5000 angstroms.

8. The display panel of claim 1, wherein light transmittance of the second partitioning wall layer is about 0.5% or lower.

9. The display panel of claim 1, wherein a thickness of the third partitioning wall layer is in a range of about 500 angstroms to about 1000 angstroms.

10. The display panel of claim 1, wherein the partitioning wall has an undercut shape and the cathode contacts an inner side face of the first partitioning wall layer of the partitioning wall.

11. The display panel of claim 1, wherein the sacrificial pattern includes an azo compound.

12. A display panel comprising:
a base layer;
a pixel defining film which is disposed on the base layer and in which a light-emitting opening is defined;

a partitioning wall which is disposed on the pixel defining film and in which a partitioning wall opening corresponding to the light-emitting opening is defined, the partitioning wall including:
a first partitioning wall layer disposed on the pixel defining film and including an indium zinc oxide;
a second partitioning wall layer disposed on the first partitioning wall layer and including a molybdenum-tantalum alloy oxide; and
a third partitioning wall layer disposed on the second partitioning wall layer, and including an aluminum oxide; and
a light-emitting element disposed in the partitioning wall opening, the light-emitting element including:
an anode;
a middle layer; and
a cathode contacting the partitioning wall.

13. The display panel of claim 12, wherein the first partitioning wall layer and a first portion of the second partitioning wall layer define a first area of the partitioning wall opening, and
wherein a second portion of the second partitioning wall layer and the third partitioning wall layer define a second area of the partitioning wall opening.

14. The display panel of claim 12, further comprising a sacrificial pattern disposed on the anode, wherein the sacrificial pattern includes an azo compound, wherein a sacrificial opening overlapping the light-emitting opening is defined in the sacrificial pattern.

15. The display panel of claim 12, wherein a thickness of the first partitioning wall layer is in a range of about 1000 angstroms to about 2500 angstroms,
wherein a thickness of the second partitioning wall layer is in a range of about 4000 angstroms to about 5000 angstroms, and
wherein a thickness of the third partitioning wall layer is in a range of about 500 angstroms to about 1000 angstroms.

16. The display panel of claim 12, wherein light transmittance of the second partitioning wall layer is about 0.5% or lower, and
wherein the third partitioning wall layer includes a material having a Young's modulus of about 300 gigapascals or greater.

17. A method for manufacturing a display panel, the method comprising:
providing a pre-display panel, the pre-display panel including a base layer, an anode disposed on the base layer, and a pre-pixel defining film disposed on the base layer;
forming a first pre-partitioning wall layer including an indium zinc oxide on the pre-display panel;
forming a second pre-partitioning wall layer including a molybdenum-tantalum alloy oxide on the first pre-partitioning wall layer;
forming a third pre-partitioning wall layer including an aluminum oxide on the second pre-partitioning wall layer;
etching the first to third pre-partitioning wall layers and forming a partitioning wall in which a partitioning wall opening is defined; and
forming a light-emitting pattern and a cathode which contacts the partitioning wall in the partitioning wall opening.

18. The method of claim 17, wherein the etching the first to third pre-partitioning wall layers and the forming the partitioning wall in which the partitioning wall opening is defined include:

performing first etching of the first to third pre-partitioning wall layers; and performing second etching of the first pre-partitioning wall layer and the second pre-partitioning wall layer and forming a first partitioning wall layer, a second partitioning wall layer, and a third partitioning wall layer, wherein the first partitioning wall layer and a first portion of the second partitioning wall layer define a first area of the partitioning wall opening, wherein a second portion of the second partitioning wall layer and the third partitioning wall layer define a second area of the partitioning wall opening, and wherein the second area has a width different from a width of the first area.

19. The method of claim 17, wherein the pre-display panel further includes a pre-sacrificial pattern disposed between the anode and the pre-pixel defining film, wherein the pre-sacrificial pattern includes an azo compound, and wherein the method further comprises etching the pre-sacrificial pattern to form a sacrificial pattern in which a sacrificial opening overlapping the anode is defined.

* * * * *